(12) United States Patent
Kim et al.

(10) Patent No.: US 12,175,940 B2
(45) Date of Patent: Dec. 24, 2024

(54) LIGHT EMITTING DISPLAY DEVICE

(71) Applicant: LG DISPLAY CO., LTD., Seoul (KR)

(72) Inventors: Jae-Min Kim, Paju-si (KR); Bong-Hwan Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/426,934

(22) Filed: Jan. 30, 2024

(65) Prior Publication Data
US 2024/0257765 A1 Aug. 1, 2024

(30) Foreign Application Priority Data
Jan. 31, 2023 (KR) .......................... 10-2023-0012435

(51) Int. Cl.
G09G 3/3266 (2016.01)
H10K 59/121 (2023.01)

(52) U.S. Cl.
CPC ....... *G09G 3/3266* (2013.01); *H10K 59/1213* (2023.02); *G09G 2300/0426* (2013.01); *G09G 2310/08* (2013.01)

(58) Field of Classification Search
None
See application file for complete search history.

(56) References Cited

U.S. PATENT DOCUMENTS

| | | | |
|---|---|---|---|
| 11,417,265 B2* | 8/2022 | Seo | G09G 3/22 |
| 2021/0027697 A1* | 1/2021 | Yoon | G09G 3/20 |
| 2021/0035488 A1* | 2/2021 | Seo | G09G 3/3225 |
| 2021/0110774 A1* | 4/2021 | Cho | G09G 3/3266 |

FOREIGN PATENT DOCUMENTS

KR 10-2022-0030344 A 3/2022

* cited by examiner

*Primary Examiner* — Krishna P Neupane
(74) *Attorney, Agent, or Firm* — POLSINELLI PC

(57) ABSTRACT

A light emitting display device in which odd scan stages receive odd first and second scan clocks alternately, and even scan stages receive an even scan clock, in a multi-frequency mode in which a first region is driven at a higher frequency than a second region, an odd first scan clock is provided to a n+5-th scan stage at a begin of the second region, an even scan clock is provided to a n+4-th scan stage at an end of the first region, and an odd second scan clock is provided to a n+3-th scan stage of the first region, and in the multi-frequency mode, during a driving frame of refreshing the first region and refresh-skipping the second region, the odd first scan clock does not have an i+2-th clock pulse corresponding to a scan pulse of the n+4-th first scan line.

21 Claims, 7 Drawing Sheets

LIGHT EMITTING DISPLAY DEVICE

CROSS-REFERENCE TO RELATED APPLICATION

The present application claims the priority of Korean Application No. 10-2023-0012435 filed on Jan. 31, 2023, which is hereby incorporated by reference in its entirety for all purposes as if fully set forth herein.

BACKGROUND

Field of the Disclosure

The present disclosure relates to a light emitting display device.

Description of the Background

As the information society develops, a demand for display devices for displaying images have increased in various forms, and in recent years, various flat display devices such as light emitting display devices and liquid crystal display devices have been used.

Among these flat display devices, the light emitting display device equipped with a light emitting diode, which is a self-luminescent element, has been widely used recently.

Recently, as the light emitting display device has become larger in area, a multi-frequency driving, in which a display region is divided and divided regions are driven at different frequencies, is being applied.

In this regard, in the multi-frequency driving with change from a high-frequency driving region to a low-frequency driving region, a pulse of a scan clock that controls output of a scan signal to a sampling transistor that applies a data voltage to a driving transistor is skipped at a timing when the frequency changes.

In this case, the pulse of the scan clock becomes shorter for a horizontal line located near a boundary of the high-frequency driving region, and the data voltage is not normally charged to a gate electrode of the driving transistor.

Accordingly, such the horizontal line of the high-frequency driving region is displayed with increased luminance, which may cause a problem of deterioration in image quality.

SUMMARY

Accordingly, the present disclosure is to provide a light emitting display device that can improve an abnormal luminance change of a horizontal line located near a boundary of a high-frequency driving region during a multi-frequency driving to improve image quality.

Additional features and advantages of the disclosure will be set forth in the description which follows, and in part will be apparent from the description, or may be learned by practice of the disclosure. These and other advantages of the disclosure will be realized and attained by the structure particularly pointed out in the written description and claims hereof as well as the appended drawings.

To achieve these and other advantages and in accordance with the purpose of the present disclosure, as embodied and broadly described herein, a light emitting display device includes a display panel in which a display region where a plurality of pixels are arranged is defined, the display region including first and second regions; a light emitting diode, a driving transistor and a sampling transistor disposed in the pixel, the driving transistor providing a driving current to the light emitting diode, the sampling transistor connected between a gate electrode and a first electrode of the driving transistor; a plurality of first scan lines each transmitting a first scan signal to the sampling transistor of the pixel that is disposed in each of the first and second regions; and a first gate driving portion including a plurality of scan stages that are respectively connected to the plurality of first scan lines, wherein the first and second regions are arranged along a scan direction for the plurality of first scan lines, wherein each of the plurality of scan stages receives an output of the first scan signal of a previous scan stage, odd scan stages among the plurality of scan stages receive odd first and second scan clocks alternately, and even scan stages among the plurality of scan stages receive an even scan clock, wherein in a multi-frequency mode in which the first region is driven at a higher frequency than the second region, the odd first scan clock is provided to a n+5-th scan stage connected to a n+5-th first scan line at a begin of the second region, the even scan clock is provided to a n+4-th scan stage connected to a n+4-th first scan line at an end of the first region, and the odd second scan clock is provided to a n+3-th scan stage connected to a n+3-th first scan line of the first region, and wherein in the multi-frequency mode, during a driving frame when the first region is refreshed and a refresh of the second region is skipped, the odd first scan clock is configured such that an i+2-th clock pulse thereof corresponding to a scan pulse of the first scan signal of the n+4-th first scan line is omitted.

In another aspect, a light emitting display device includes: a display panel in which a display region where a plurality of pixels are arranged is defined, the display region including first and second regions; a light emitting diode, a driving transistor and a sampling transistor disposed in the pixel, the driving transistor providing a driving current to the light emitting diode, the sampling transistor connected between a gate electrode and a first electrode of the driving transistor; n+3-th and n+4-th first scan lines which are each arranged in the first region and connected to the sampling transistor of the corresponding pixel, and a n+5-th first scan line which is arranged in the second region and connected to the sampling transistor of the corresponding pixel; and n+3-th to n+5-th scan stages which are respectively connected to the n+3-th to n+5-th first scan lines and output the first scan signals, wherein each of the n+3-th to n+5-th scan stages receives the first scan signal of a previous scan stage, the n+3-th and n+5-th scan stages respectively receive odd first and second scan clocks, and the n+4-th scan stage receives an even scan clock, and wherein in a multi-frequency mode in which the first region is driven at a higher frequency than the second region, during a driving frame when the first region is refreshed and a refresh of the second region is skipped, the odd first scan clock is configured such that an i+2-th clock pulse thereof corresponding to a scan pulse of the first scan signal of the n+4-th first scan line is omitted.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate aspects of the disclosure and together with the description serve to explain the principles of the disclosure.

In the drawings.

DETAILED DESCRIPTION

Figure 1:
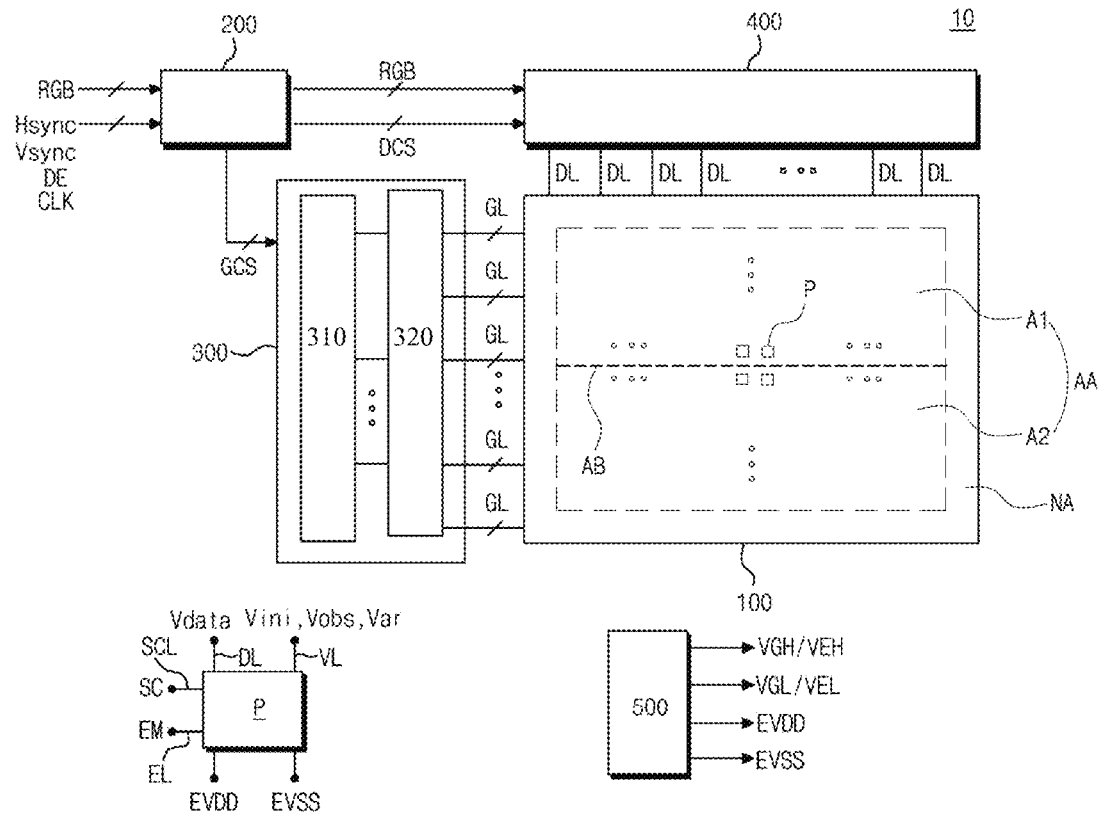
FIG. 1 is a view schematically illustrating a light emitting display device according to an aspect of the present disclosure.

Advantages and features of the present disclosure and methods of achieving them will be apparent with reference to the aspects described below in detail with the accompanying drawings. However, the present disclosure is not limited to the aspects disclosed below, but may be realized in a variety of different forms, and only these aspects allow the present disclosure to be complete. The present disclosure is provided to fully inform the scope of the disclosure to the skilled in the art of the present disclosure, and the present disclosure may be defined by the scope of the claims.

The shapes, sizes, proportions, angles, numbers, and the like disclosed in the drawings for explaining the aspects of the present disclosure are illustrative, and the present disclosure is not limited to the illustrated matters. The same reference numerals refer to the same components throughout the description.

Furthermore, in describing the present disclosure, if it is determined that a detailed description of the related known technology unnecessarily obscure the subject matter of the present disclosure, the detailed description thereof may be omitted. When 'comprising', 'including', 'having', 'consisting', and the like are used in this disclosure, other parts may be added unless 'only' is used. When a component is expressed in the singular, cases including the plural are included unless specific statement is described.

In interpreting the components, even if there is no separate explicit description, it is interpreted as including a margin range.

In the case of a description of a positional relationship, for example, when the positional relationship of two parts is described as 'on', 'over', 'above', 'below', 'beside', 'under', and the like, one or more other parts may be positioned between such two parts unless 'right' or 'directly' is used.

In the case of a description of a temporal relationship, for example, when a temporal precedence is described as 'after', 'following', 'before', and the like, cases that are not continuous may be included unless 'directly' or 'immediately' is used.

In describing components of the present disclosure, terms such as first, second and the like may be used. These terms are only for distinguishing the components from other components, and an essence, sequence, order, or number of the components is not limited by the terms.

Respective features of various aspects of the present disclosure may be partially or wholly connected to or combined with each other and may be technically interlocked and driven variously, and respective aspects may be independently implemented from each other or may be implemented together with a related relationship.

Hereinafter, aspects of the present disclosure are described in detail with reference to the drawings. Meanwhile, in the following aspects, the same and like reference numerals are assigned to the same and like components, and detailed descriptions thereof may be omitted.

Figure 2:
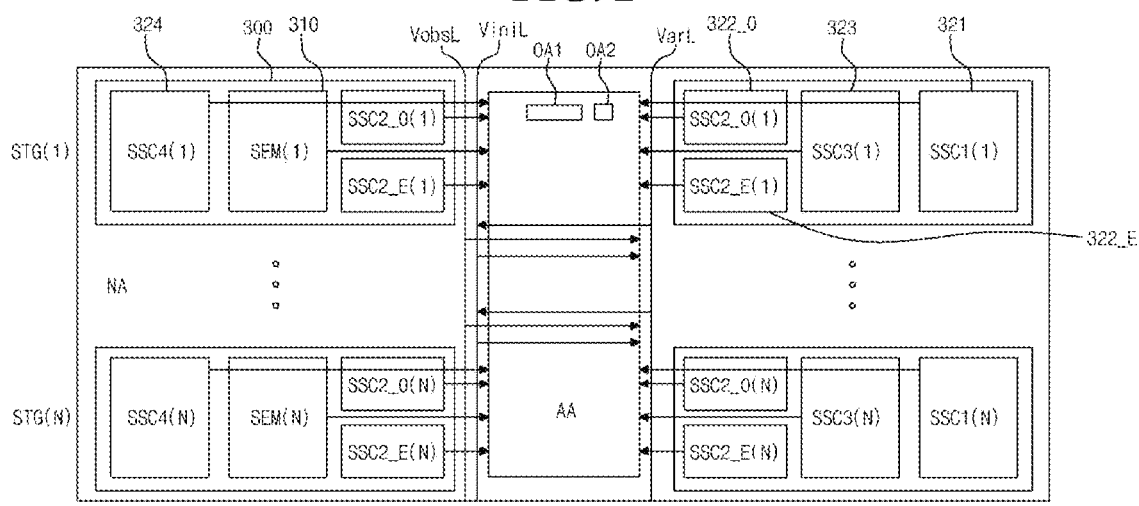
FIG. 2 is a view illustrating a configuration of a gate driving portion of a light emitting display device according to an aspect of the present disclosure.
Figure 3:
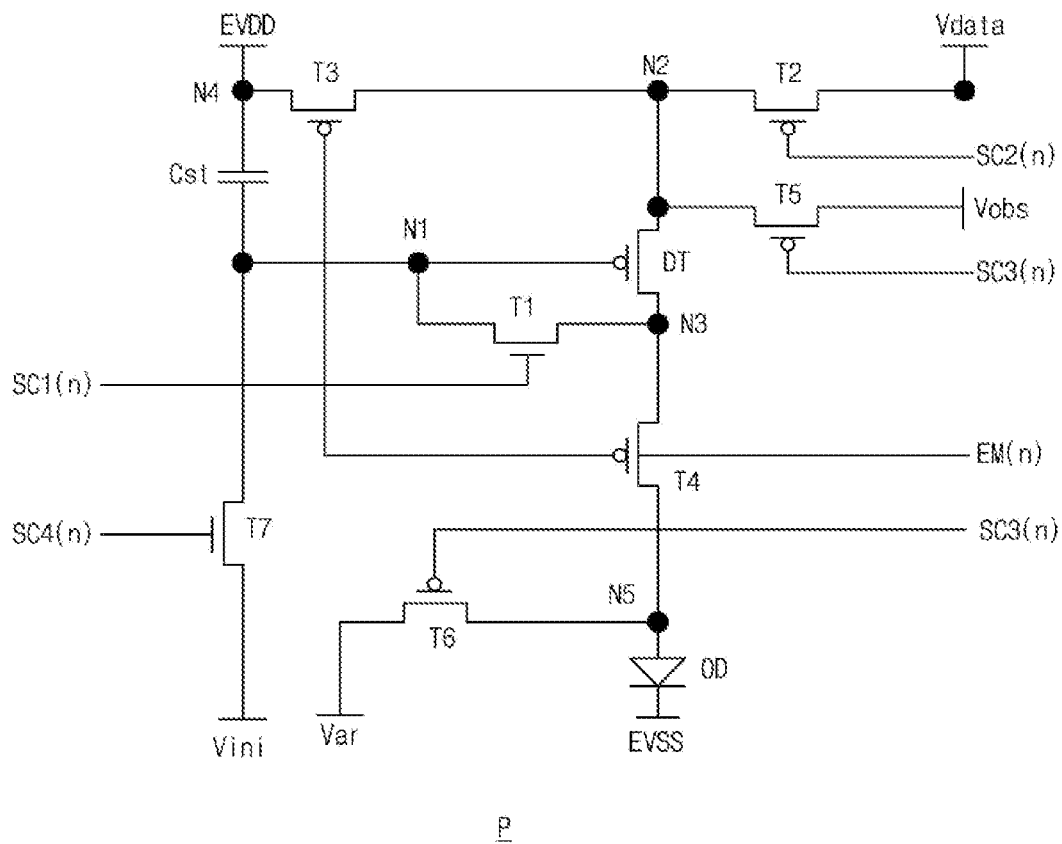
FIG. 3 is a circuit diagram schematically illustrating an example of a pixel according to an aspect of the present disclosure.
Figure 4:
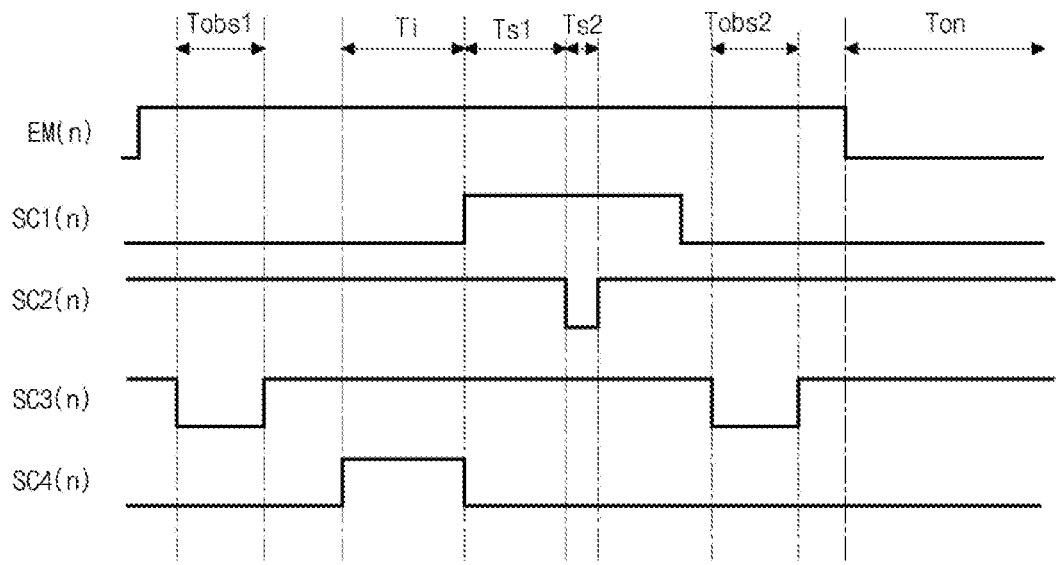
FIG. 4 is a timing diagram schematically illustrating an example of driving signals that drive a pixel of FIG. 3.

FIG. 1 is a view schematically illustrating a light emitting display device according to an aspect of the present disclosure. FIG. 2 is a view illustrating a configuration of a gate driving portion of a light emitting display device according to an aspect of the present disclosure. FIG. 3 is a circuit diagram schematically illustrating an example of a pixel according to an aspect of the present disclosure. FIG. 4 is a timing diagram schematically illustrating an example of driving signals that drive a pixel of FIG. 3.

Referring to FIGS. 1 and 2, the light emitting display device 10 according to this aspect is a multi-frequency driving light emitting device in which a screen i.e., a display region AA is divided (or separated), and the divided regions A1 and A2 may be driven at different frequencies.

This light emitting display device 10 may include a display panel (or flexible display panel) 100 including a plurality of pixels P, a controller 200, a gate driving portion 300 that supplies a gate signal to each of the plurality of pixels P, a data driving portion 400 that supplies a data signal to each of the plurality of pixels P, and a power supply portion 500 that supplies power for driving each of the plurality of pixels P.

The display panel 100 may comprise the display region AA in which the pixels P are arranged in a matrix form along a plurality of horizontal lines (or row lines) and a plurality of vertical lines (or column lines), and a non-display region NA that is outside the display region AA and surrounds the display region AA. For example, the gate driving portion 300 may be disposed in the non-display region NA, but not limited thereto.

The display panel 100 may be driven using a multi-frequency driving method. In this regard, for example, the display region AA may be divided (or separated) into a plurality of (or N (which is a natural number of 2 or greater) regions that may be driven at different frequencies (or refresh rates), for example, first and second regions A1 and A2.

The first and second regions A1 and A2 may be driven at the same frequency or be driven at separate frequencies. For example, in a normal (or general) mode (or same frequency mode), the first and second regions A1 and A2 may be driven at the same frequency, and in a multi-frequency mode (or frequency separation mode), the first and second regions A1 and A2 may be driven individually at different frequencies.

The first and second regions A1 and A2 may be arranged (or located) along a scan direction of the display panel 100. For example, the scan direction of the display panel 100 in this aspect may be a vertical direction from top to bottom in the drawing, and the display region AA may be divided into the first region A1 where horizontal lines that are scanned (or driven) first along the scan direction are located, and the second region A2 where horizontal lines scanned after the first region A1 are located.

Meanwhile, positions of the first and second regions A1 and A2 may not be fixed and may be adjusted as needed. For example, a size (or length) of the first region A1 may be increased and a size of the second region A2 may be reduced accordingly. Conversely, the size of the first region A1 may be reduced and the size of the second region A2 may be increased accordingly.

As mentioned earlier, in the multi-frequency driving mode, the first and second regions A1 and A2 may be driven at different frequencies. For example, the first region A1 may be driven at a relatively high frequency and the second region A2 may be driven at a relatively low frequency. Conversely, the first region A1 may be driven at a low frequency and the second region A2 may be driven at a high frequency.

In multi-frequency mode, the display panel 100 may be driven with frames set to a number corresponding to a high frequency. In this case, a high-frequency driving region, for example, the first region A1 may perform an image refresh operation every frame. A low-frequency driving region, for example, the second region A2 may perform an image refresh operation in each of frames corresponding to the low frequency, and in each of the remaining frames, the second region A2 may perform a skip operation, which skips (or omit) an image refresh, without an image refresh operation. Here, a previous image may be displayed as is in the frame in which the skip operation is performed.

Meanwhile, in this aspect, when driving in the multi-frequency mode that changes from a high-frequency driving to a low-frequency driving along the scan direction, it is configured to provide a normal scan signal to a horizontal line of the first region A1 that is disposed near a boundary AB between the high-frequency first region A1 and the low-frequency second region A2. Accordingly, it is possible to charge a normal data voltage to the pixel P arranged on the horizontal line of the first region A1 located near the boundary AB where the frequency changes, thereby making it possible to express a normal luminance. Thus, it is possible to prevent image quality deterioration due to abnormal luminance change that is caused by abnormal charging of the data voltage. The specific configuration and driving method for this is described later.

In the display panel 100, a plurality of gate lines GL and a plurality of data lines DL may cross each other, and each of the plurality of pixels P may connected to the corresponding gate line GL and data line DL. Specifically, one pixel P may receive the gate signal from the gate driving portion 300 through the gate line GL, the data signal from the data driving portion 400 through the data line DL, and a high-potential driving voltage EVDD and a low-potential driving voltage EVSS from the power supply portion 500.

Here, the gate line GL may supply a scan signal SC and an emission control signal (or a scan signal for emission control) EM, and the data line DL may supply a data voltage Vdata. In addition, according to various aspects, the gate line GL may include a plurality of scan lines SCL that supply the scan signals SC and an emission control signal line EL that supplies the emission control signal EM. In addition, the plurality of pixels P may further include power lines VL to receive a bias voltage Vobs and initialization voltages Var and Vini.

In addition, each pixel P may include the light emitting diode (or light emitting element) OD and a pixel circuit that controls a driving of the light emitting diode OD, as shown in FIG. 3.

The pixel circuit may include a plurality of switching elements, a driving element, and a capacitor. Here, the switching elements and driving element may be formed of thin film transistors. In the pixel circuit, the driving element may control an amount of current supplied to the light emitting diode OD according to the data voltage Vdata to adjust an amount of emission of the light emitting diode OD. In addition, the plurality of switching elements may operate the pixel circuit by receiving the scan signals SC supplied through the plurality of scan lines SCL and the emission control signal EM supplied through the emission control line EL.

The display panel 100 may be configured as a non-transmissive display panel or a transmissive display panel. A transmissive display panel may be applied to a transparent display device where an image is displayed on a screen and an actual object in a background is visible.

The pixels P may be divided into a red pixel, a green pixel, and a blue pixel to implement a full color. The pixels P may further include a white pixel.

Touch sensors may be disposed on the display panel 100. A touch input may be sensed using separate touch sensors or may be sensed through the pixels P. The touch sensors may be placed on the screen of the display panel 100 as an on-cell type sensors or add-on type sensors, or may be implemented as in-cell type sensors built into the display panel 100.

The controller 200 may process image data RGB input from a host system outside the light emitting display device 10 to suit size and resolution of the display panel 100 and supply them to the data driving portion 400. The controller 200 may use synchronization signals input from the outside, for example, a dot clock signal CLK, a data enable signal DE, a horizontal synchronization signal Hsync, and a vertical synchronization signal Vsync to generate a gate control signal GCS and a data control signal DCS. The controller 200 may supply the generated gate control signal GCS and data control signal DCS to the gate driving portion 300 and the data driving portion 400, respectively, to control the gate driving portion 300 and the data driving portion 400.

The controller 200 may be configured by being combined with various processors, for example, a microprocessor, a mobile processor, an application processor, etc., depending on a device on which it is mounted.

A voltage level of the gate control signal GCS output from the controller 200 may be converted into a gate-on voltage (or gate low voltage) VGL or VEL and a gate-off voltage (or gate high voltage) VGH or VEH through a level shifter (not shown) and then be supplied to the gate driving portion 300. The level shifter may convert a low level voltage of the gate control signal GCS into the gate low voltage VGL, and convert a high level voltage of the gate control signal GCS into the gate high voltage VGH. The gate control signal GCS may include a start pulse and a gate clock (or shift clock).

The gate driving portion 300 may supply the gate signal to the gate line GL according to the gate control signal GCS from the controller 200. The gate driving portion 300 may be disposed in the non-display region NA on one or both sides of the display panel 100 in a gate in panel (GIP) structure.

The gate driving portion 300 may sequentially output the gate signals to the plurality of gate lines GL under the control of the controller 200. The gate driving portion 300 may sequentially supply the gate signals to the gate lines GL by shifting the gate signal using a shift register.

As mentioned above, the gate signal may include the scan signal SC and the emission control signal EM. The scan signal SC may include a scan pulse that swings between the gate-on voltage VGL (or gate-off voltage) and the gate-off voltage VGH (or gate-on voltage). The emission control signal EM may include an emission control signal pulse that swings between the gate-on voltage VEL and the gate-off voltage VEH.

The scan pulse may be synchronized with the data voltage Vdata and select the pixels P of a horizontal line where data are written. The emission control signal EM may define an emission time of the pixels P.

The gate driving portion 300 may include an emission control signal driving portion 310 and at least one scan driving portion 320.

The emission control signal driving portion 310 may output an emission control signal pulse in response to a start pulse and a corresponding gate clock (or emission clock) from the controller 200, and may sequentially shift the emission control signal pulse according to the gate clock.

At least one scan driving portion 320 may output a scan pulse in response to a start pulse and a corresponding gate clock (or scan clock) from the controller 200, and may shift the scan pulse according to the gate clock timing.

Hereinafter, the gate driving portion 300 of this aspect is described in more detail with further reference to FIG. 2.

The scan driving portion 320 may be configured with first to fourth scan driving portions 321, 322, 323, and 324. In addition, the second scan driving portion 322 may include an odd second scan driving portion 322_O and an even second scan driving portion 322_E.

The gate driving portion 300 may have shift registers configured symmetrically on both sides of the display region AA. In addition, the shift register on one side of the display region AA may be configured to include the second scan driving portion 322_O and 322_E, the fourth scan driving portion 324, and the emission control signal driving portion 310, and the shift register on the other side of the display region AA may be configured to include the first scan driving portion 321, the second scan driving portion 322_O and 322_E, and the third scan driving portion 323. However, the configuration of the gate driving portion 300 is not limited to this, and the emission control signal driving portion 310 and the first to fourth scan driving portions 321, 322, 323, and 324 may be arranged differently according to aspects.

Stages STG(1) to STG(N) of the shift register may include first scan signal generators SSC1(1) to SSC1(N), second scan signal generators SSC2_O(1) to SSC2_O(N) and SSC2_E(1) to SSC2_E(N), third scan signal generators SSC3(1) to SSC3(N), fourth scan signal generators SSC4(1) to SSC4(N), and emission control signal generators SEM(1) to SEM(N), respectively.

For example, the first scan signal generators SSC1(1) to SSC1(N) may output the first scan signals SC1(1) to SC1(N) through the first scan lines of the display panel 100. The second scan signal generators SSC2(1) to SSC2(N) may output the second scan signals SC2(1) to SC2(N) through the second scan lines of the display panel 100. The third scan signal generators SSC3(1) to SSC3(N) may output the third scan signals SC3(1) to SC3(N) through the third scan lines of the display panel 100. The fourth scan signal generators SSC4(1) to SSC4(N) may output the fourth scan signals SC4(1) to SC4(N) through the fourth scan lines of the display panel 100. The emission control signal generators SEM(1) to SEM(N) may output the emission control signals EM(1) to EM(N) through the emission control lines EL of the display panel 100.

The first scan signals SC1(1) to SC1(N) may each be used as a signal to drive a A transistor (e.g., a sampling transistor (or compensation transistor), etc.) included in the pixel circuit. The second scan signals SC2(1) to SC2(N) may each be used as a signal to drive a B transistor (e.g., a data supply transistor, etc.) included in the pixel circuit. The third scan signals SC3(1) to SC3(N) may each be used as a signal to drive a C transistor (e.g., a bias transistor, etc.) included in the pixel circuit. The fourth scan signals SC4(1) to SC4(N) may each be used as a signal to drive a D transistor (e.g., an initialization transistor, etc.) included in the pixel circuit. The emission control signals EM(1) to EM(N) may each be used as a signal to drive a E transistor (e.g., an emission control transistor, etc.) included in the pixel circuit. For example, when the emission control transistor of the pixel is controlled using the corresponding one of the emission control signals EM(1) to EM(N), the emission time of the light emitting element may be varied.

Referring to FIG. 2, a bias voltage bus line VobsL, a first initialization voltage bus line VarL, and a second initialization voltage bus line ViniL may be disposed between the gate driving portion 300 and the display region AA.

The bias voltage bus line VobsL, the first initialization voltage bus line VarL, and the second initialization voltage bus line ViniL may respectively supply the bias voltage Vobs, the first initialization voltage Var, and the second initialization voltage Vini to the pixel circuit from the power supply portion 500.

In the drawing, each of the bias voltage bus line VobsL, the first initialization voltage bus line VarL, and the second initialization voltage bus line ViniL are shown as being located only on one side i.e., the left or right side of the display region AA, but not limited thereto, and may be located on both sides, and even if located on one side, the location is not limited to the left or right.

Referring to FIG. 2, one or more optical regions OA1 and OA2 may be disposed in the display region AA.

One or more optical regions OA1 and OA2 may be arranged to overlap one or more optical electronic device, for example, a photographing device such as a camera (or image sensor), and/or a detection sensor such as a proximity sensor or an illuminance sensor. For the operation of the optical electronic device, one or more optical regions OA1 and OA2 may have a light transmittance structure formed therein and have transmittance above a certain level. In other words, a number of pixels P per unit area in one or more optical regions OA1 and OA2 may be smaller than a number of pixels P per unit area in a general region excluding the optical regions OA1 and OA2 in the display region AA. That is, a resolution of one or more optical regions OA1 and OA2 may be lower than a resolution of the general region in the display region AA.

Referring again to FIG. 1, the data driving portion 400 may convert the image data RGB into the data voltages Vdata according to the data control signal DCS supplied from the controller 200, and supply the converted data voltages Vdata to the corresponding pixels P through the data lines DL.

In FIG. 1, the data driving portion 400 is shown as being arranged in a single form on one side of the display panel 100, but number and position of the data driving portion 400 are not limited thereto.

In other words, the data driving portion 400 may be formed of a plurality of integrated circuits (ICs) and may be arranged to be divided into a plurality of units on one side of the display panel 100.

The power supply portion 500 may use a DC-DC converter to generate direct current (DC) power necessary to drive the pixel array of the display panel 100 and a driving portion of the display panel 100. The DC-DC converter may include a charge pump, a regulator, a buck converter, a boost converter, etc. The power supply portion 500 may receive a power voltage as a driving voltage, for driving the light emitting display device 10, from a host system, and generate DC voltages such as the gate-on voltages VGL and VEL, the gate-off voltages VGH and VEH, the high-potential driving voltage EVDD, and the low-potential driving voltage EVSS. The gate-on voltages VGL and VEL and the gate-off voltages VGH and VEH may be supplied to a level shifter (not shown) and the gate driving portion 300. The high-potential driving voltage EVDD and the low-potential driving voltage EVSS may be commonly supplied to the pixels P.

Referring to FIG. 3, the pixel circuit in the pixel P is described.

FIG. 3 shows a pixel circuit as an example for explanation, and a pixel circuit is not limited as long as its structure may receive the emission control signal EM (n) and control emission of the light emitting diode OD. For example, the pixel circuit may include an additional scan signal and a switching thin film transistor receiving the additional scan signal, and a switching thin film transistor to which an additional initialization voltage is applied, and a connection relationship of the switching element and a connection position of the capacitor may be made in various ways. Hereinafter, for convenience of explanation, the display device 10 having the pixel circuit structure of FIG. 3 is described.

Referring to FIG. 3, each of the plurality of pixels P may include a pixel circuit having a driving transistor DT and a light emitting diode OD connected to the pixel circuit.

The pixel circuit may control a driving current (or emission current) flowing to the light emitting diode OD to drive the light emitting diode OD. The pixel circuit may include the driving transistor DT, first to seventh transistors T1 to T7, and a capacitor Cst. Each of the transistors DT, and T1 to T7 may include a first electrode, a second electrode, and a gate electrode. One of the first electrode and the second electrode may be a source electrode, and the other of the first electrode and the second electrode may be a drain electrode.

Each of the transistors DT, and T1 to T7 may be a P-type thin film transistor or an N-type thin film transistor. In the aspect of FIG. 3, the first transistor T1 and the seventh transistor T7 are N-type thin film transistors, and the remaining transistors DT, and T2 to T6 are P-type thin film transistors. However, the present disclosure is not limited thereto, and according to aspects, all or part of the transistors DT, and T1 to T7 may be P-type thin film transistors or N-type thin film transistors. In addition, the N-type thin film transistor may be an oxide thin film transistor, and the P-type thin film transistor may be a polycrystalline silicon thin film transistor.

Hereinafter, the first transistor T1 and the seventh transistor T7 configured with N-type thin film transistors, and the remaining transistors DT, and T2 to T6 configured with P-type thin film transistors are explained by way of example. Accordingly, the first transistor T1 and the seventh transistor T7 are turned on by receiving a high voltage, and the remaining transistors DT, and T2 to T6 are turned on by receiving a low voltage.

According to one example, the first transistor T1 may serve as a sampling transistor, the second transistor T2 may serve as a data supply transistor, the third and fourth transistors T3 and T4 may serve as emission control transistors, and the fifth transistor T5 may serve as a bias transistor, and the sixth and seventh transistors T6 and T7 may serve as initialization transistors.

The light emitting diode OD may include an anode electrode and a cathode electrode. The anode electrode of the light emitting diode OD may be connected to a fifth node N5, and the cathode electrode of the light emitting diode OD may be connected to a line supplying the low-potential driving voltage EVSS.

The driving transistor DT may include a first electrode connected to a second node N2, a second electrode connected to a third node N3, and a gate electrode connected to a first node N1. The driving transistor DT may provide a driving current (Id) to the light emitting diode OD based on a voltage of the first node N1 (or a data voltage stored in the capacitor Cst as described later).

The first transistor T1 may include a first electrode connected to the first node N1, a second electrode connected to the third node N3, and a gate electrode that receives the first scan signal SC1($n$). The first transistor T1 may be turned on in response to the first scan signal SC1($n$), and form a diode connection between the first node N1 and the third node N3 to sample a threshold voltage (Vth) of the driving transistor DT and also sample (or apply) the data voltage Vdata to the gate electrode of the driving transistor DT. The first transistor T1 may be a sampling transistor.

The capacitor Cst may be connected between the first node N1 and a fourth node N4. The capacitor Cst may store or maintain the high-potential driving voltage EVDD provided thereto.

The second transistor T2 may include a first electrode connected to the data line DL (or receiving the data voltage Vdata), a second electrode connected to the second node N2, and a gate electrode that receives the second scan signal SC2($n$). The second transistor T2 may be turned on in response to the second scan signal SC2($n$) and transmit the data voltage Vdata to the second node N2. The second transistor T2 may be a data supply transistor.

The third transistor T3 and the fourth transistor T4 (or first and second emission control transistors) may be connected between a line supplying the high-potential driving voltage EVDD and the light emitting diode OD, and form a current movement path through which the driving current (Id) generated by the driving transistor DT moves.

The third transistor T3 may include a first electrode connected to a fourth node N4 to receive the high-potential driving voltage EVDD, a second electrode connected to the second node N2, and a gate electrode that receives the emission control signal EM(n).

The fourth transistor T4 may include a first electrode connected to the third node N3, a second electrode connected to a fifth node N5 (or the anode electrode of the light emitting diode OD), and a gate electrode that receives the emission control signal EM(n).

The third and fourth transistors T3 and T4 may be turned on in response to the emission control signal EM(n), and in this case, the driving current (Id) may be provided to the light emitting diode OD, and the light emitting diode OD may emit light with luminance corresponding to the driving current (Id).

The fifth transistor T5 may include a first electrode receiving the bias voltage Vobs, a second electrode connected to the second node N2, and a gate electrode receiving the third scan signal SC3(n). The fifth transistor T5 may be a bias transistor.

The sixth transistor T6 may include a first electrode receiving the first initialization voltage Var, a second electrode connected to the fifth node N5, and a gate electrode receiving the third scan signal SC3(n).

The sixth transistor T6 may be turned on in response to the third scan signal SC3 (n) before emission of the light emitting diode OD (or after emission of the light emitting diode OD), and may initialize the anode electrode of the light emitting diode OD using the first initialization voltage Var. In this regard, the light emitting diode OD may have a parasitic capacitor formed between the anode electrode and the cathode electrode. While the light emitting diode OD emits light, the parasitic capacitor may be charged so that the anode electrode of the light emitting diode OD may have a certain voltage. Accordingly, by applying the first initialization voltage Var to the anode electrode of the light emitting diode OD through the sixth transistor T6, an amount of charge accumulated in the light emitting diode OD may be initialized.

In this aspect, the gate electrodes of the fifth and sixth transistors T5 and T6 may be configured to commonly receive the third scan signal SC3 (n). However, the present disclosure is not necessarily limited to this, and the gate electrodes of the fifth and sixth transistors T5 and T6 may be configured to be independently controlled by receiving separate scan signals.

The seventh transistor T7 may include a first electrode receiving the second initialization voltage Vini, a second electrode connected to the first node N1, and a gate electrode receiving the fourth scan signal SC4(n).

The seventh transistor T7 may be turned on in response to the fourth scan signal SC4 (n), and may initialize the gate electrode of the driving transistor DT using the second initialization voltage Vini. Unnecessary charges may remain in the gate electrode of the driving transistor DT due to the high-potential driving voltage EVDD stored in the capacitor Cst. Accordingly, by applying the second initialization voltage Vini to the gate electrode of the driving transistor DT through the seventh transistor T7, an amount of the remaining charges may be initialized.

The operation of the above pixel circuit and light emitting diode OD is described with further reference to FIG. 4.

In a frame where an image refresh is performed, the pixel P may operate with at least one bias period Tobs1 and Tobs2, an initialization period Ti, a sampling period Ts1 and Ts2, and an emission period Ton, but this is one aspect and the present disclosure is not necessarily bound to this order.

At least one bias period Tobs1 and Tobs2 may be a period when an on-bias stress (OBS) operation with the bias voltage Vobs being applied is performed. In the bias period Tobs1 and Tobs2, the emission control signal EM(n) has a high voltage, and the third and fourth transistors T3 and T4 are turned off. The first scan signal SC1(n) and the fourth scan signal SC4(n) have low voltages, and the first transistor T1 and the seventh transistor T7 are turned off. The second scan signal SC2 has a high voltage and the second transistor T2 is turned off.

The third scan signal SC3(n) is input as a low voltage, and the fifth and sixth transistors T5 and T6 are turned on. As the fifth transistor T5 is turned on, the bias voltage Vobs is applied to the first electrode of the driving transistor DT connected to the second node N2.

Here, the bias voltage Vobs is supplied to the third node N3 that is the drain electrode of the driving transistor DT, so that a charging time or charging delay of the voltage of the fifth node N5, which is the anode electrode of the light emitting diode OD, in the emission period Ton may be reduced. The driving transistor DT maintains a stronger saturation state.

For example, as the bias voltage Vobs increases, the voltage of the third node N3 that is the drain electrode of the driving transistor DT may increase, and the gate-source voltage or drain-source voltage of the driving transistor DT may decrease. Thus, the bias voltage Vobs may be at least greater than the data voltage Vdata.

At this time, a magnitude of the drain-source current (Id) passing through the driving transistor DT may be reduced, and a stress of the driving transistor DT may be reduced in a positive bias stress situation, thereby resolving the charging delay of the voltage of the third node N3. In other words, performing the on-bias stress (OBS) operation before sampling the threshold voltage (Vth) of the driving transistor DT may alleviate a hysteresis of the driving transistor DT.

The initialization period Ti may be a period for initializing the voltage of the gate electrode of the driving transistor DT.

The first scan signal SC1(n) has a low voltage, and the second to fourth scan signals SC2(n) to SC4(n) and the emission control signal EM(n) have high voltages, and the seventh transistor T7 is turned on. The first to sixth transistors T1 to T6 are turned off. As the seventh transistor T7 is turned on, the gate electrode of the driving transistor DT connected to the first node N1 is initialized to the second initialization voltage Vini.

The sampling period Ts1 and Ts2 may be a period that samples the threshold voltage (Vth) of the driving transistor DT and samples (or writes) the data voltage Vdata.

In a first sampling period Ts1 that samples the threshold voltage (Vth), the first scan signal SC1 (n), the second scan signal SC2 (n), the third scan signal SC3 (n), and the emission control signal EM (n) have high voltages, and the fourth scan signal SC4 (n) has a low voltage. Accordingly, the second to seventh transistors T2 to T7 are turned off, the first transistor T1 remains on. The first transistor T1 forms a diode connection between the first node N1 and the third node N3, so the threshold voltage (Vth) of the driving transistor DT may be sampled.

Meanwhile, in a second sampling period Ts2 after the first sampling period Ts1, the second scan signal SC2 (n) is converted to a low voltage. Accordingly, the second transistor T2 is turned on, so the data voltage Vdata may be sampled (i.e., written) to the gate electrode of the driving transistor DT and charged.

The emission period Ton may be a period when the sampled threshold voltage (Vth) is offset and the light emitting diode OD emits light with the driving current (Id) corresponding to the written data voltage Vdata.

The emission control signal EM(n) has a low voltage, and the third and fourth transistors T3 and T4 are turned on.

As the third transistor T3 is turned on, the high-potential driving voltage EVDD supplied to the fourth node N4 is applied to the first electrode of the driving transistor DT connected to the second node N2 through the third transistor T3. The driving current (Id) supplied from the driving transistor DT to the light emitting diode OD via the fourth transistor T4 becomes independent of the value of the threshold voltage (Vth) of the driving transistor DT, so that the threshold voltage (Vth) of the driving transistor DT is compensated and operates.

Meanwhile, in this aspect, for example, the pixels P located on an odd horizontal line and an even horizontal lines, which are two neighboring horizontal lines in the display panel 100, may be configured to share at least the first scan signal SC1 (n). In other words, each scan line SCL transmitting the first scan signal SC1 (n) may be configured to be connected to two adjacent horizontal lines in the display panel 100. Alternatively, the first scan signal SC1 (n) may be output corresponding to each horizontal line of the display panel 100.

Moreover, similar to the first scan signal SC1(n), at least one of the second and fourth scan signals SC2(n) and SC4(n) may be configured to be commonly applied to two neighboring horizontal lines of the display panel 100.

Figure 5:
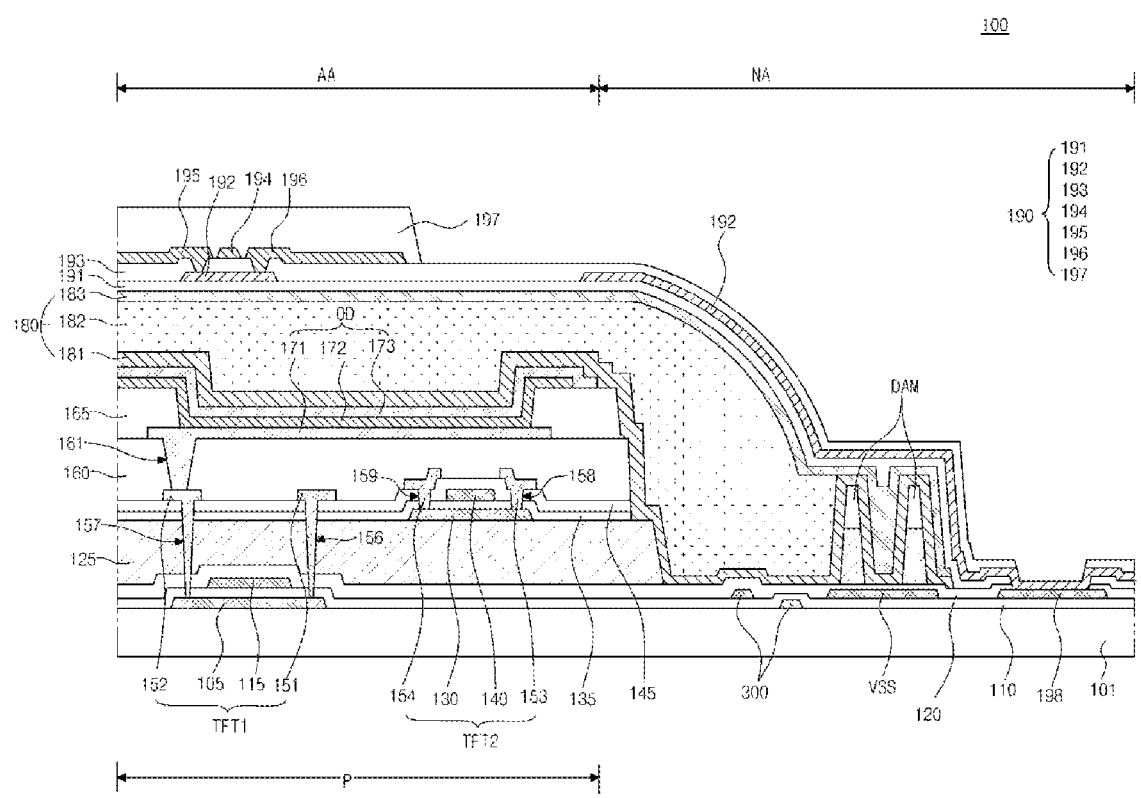
FIG. 5 is a cross-sectional view schematically illustrating an example of a cross-sectional structure of a display panel according to an aspect of the present disclosure.

Hereinafter, an example of a cross-sectional structure of the display panel 100 of this aspect is described with further reference to FIG. 5. FIG. 5 is a cross-sectional view schematically illustrating an example of a cross-sectional structure of a display panel according to an aspect of the present disclosure.

In FIG. 5, for convenience of explanation, two thin film transistors TFT1 and TFT2 are shown in the pixel P in the display region AA. Here, the thin film transistor TFT1 located relatively lower and close to the substrate 101 is referred to as a first thin film transistor TFT1, which may be a polycrystalline silicon thin film transistor. The thin film transistor TFT2 located relatively upper and far from the substrate 101 is referred to as a second thin film transistor TFT2, which may be an oxide thin film transistor.

Meanwhile, in this aspect, a case where the first thin film transistor TFT1 is a driving transistor (DT of FIG. 3) is taken as an example. Further, a case where the second thin film transistor TFT2 is one of the first to seventh transistors (T1 to T7 of FIG. 3) that are switching thin film transistors, more specifically, a transistor connected to the capacitor Cst is taken as an example. For convenience of explanation, the first thin film transistor TFT1 is shown as connected to the light emitting diode OD.

The substrate 101 may be formed of, for example, a thin glass substrate (or glass film) or a plastic substrate (or plastic film) to implement a flexible characteristics of the display panel 100, but not limited thereto.

The first thin film transistor TFT1 may include a first semiconductor layer 105 disposed on the substrate 101, a first gate electrode 115 that overlaps the first semiconductor layer 105 with a first insulating layer 110 interposed therebetween, and a first source electrode 151 and a first drain electrode 152 located on a fourth insulating layer 145 over the first gate electrode 115. Here, the first semiconductor layer 105 may be formed of polycrystalline silicon, but not limited thereto.

The first semiconductor layer 105 may include a central channel region and source and drain regions on both sides. The first source electrode 151 and the first drain electrode 152 may be connected to the source region and the drain region of the first semiconductor layer 105 through first and second contact holes 156 and 157 that are formed in the insulating layers 110, 120, 125, 135, and 145 located below the first source and drain electrodes 151 and 152.

A second insulating layer 120 may be formed on the first gate electrode 115 of the first thin film transistor TFT1.

A first interlayered insulating layer 125 may be formed on the second insulating layer 120. The second thin film transistor TFT2 may be formed on the first interlayered insulating layer 125.

The second thin film transistor TFT2 may include a second semiconductor layer 130 on the first interlayered insulating layer 125, a second gate electrode 140 that overlaps the second semiconductor layer 130 with a third insulating layer 135 interposed therebetween, and a second source electrode 153 and a second drain electrode 154 located on the fourth insulating layer 145 over the second gate electrode 140. Here, the second semiconductor layer 130 may be formed of an oxide semiconductor, but not limited thereto.

The second semiconductor layer 130 may include a central channel region and source and drain regions on both sides. The second source electrode 153 and the second drain electrode 154 may be connected to the source region and the drain region of the second semiconductor layer 130 through third and fourth contact holes 158 and 159 formed in the insulating layers 135 and 145 located below the second source and drain electrodes 153 and 154.

A second interlayered insulating layer (or first planarization layer) 160 may be formed on the second thin film transistor TFT2.

Here, the first, second, third, and fourth insulating layers 110, 120, 135, and 145 may be made of an inorganic insulating material such as silicon nitride or silicon oxide, but not limited thereto.

In addition, the first and second interlayered insulating layers 125 and 160 may be made of an organic insulating material such as photo acrylic or benzocyclobutene, but not limited thereto.

A connection electrode 162 may be formed on the second interlayered insulating layer 160. The connection electrode 162 may be connected to the first drain electrode 152 through a contact hole 161 formed in the second interlayered insulating layer 160.

A third interlayered insulating layer (or second planarization layer) 163 may be formed on the connection electrode 162. The third interlayered insulating layer 163 may be made of an organic insulating material such as photo acrylic or benzocyclobutene, but not limited thereto.

The light emitting diode OD and a bank layer 165 may be formed on the third interlayered insulating layer 163.

The light emitting diode OD may include an anode electrode (or first electrode) 171, a light emitting layer 172, and a cathode electrode (or second electrode) 173.

The anode electrode 171 may be connected to the connection electrode 162 through the contact hole 164 formed in the third interlayered insulating layer 163.

The bank layer 165 may be disposed along a boundary of the pixel P and may be formed to cover an edge of the anode electrode 171. The light emitting layer 172 may be formed on the anode electrode 171 exposed through an opening of the bank layer 165.

The cathode electrode 173 may be formed on the light emitting layer 172 and may be applied with the low-potential driving voltage (EVSS of FIGS. 1 and 3).

An encapsulation layer 180 may be formed on the cathode electrode 173. The encapsulation layer 180 may include at least one inorganic encapsulation layer and at least one organic encapsulation layer, but not limited thereto. In the present disclosure, a structure of the encapsulation layer 180, in which a first encapsulation layer 181, a second encapsulation layer 182, and a third encapsulation layer 183 are sequentially stacked, is described as an example.

The first encapsulation layer 181 may be formed on the substrate 101 on which the cathode electrode 173 is formed. The third encapsulation layer 183 may be formed on the substrate 101 on which the second encapsulation layer 182 is formed, and may be configured to surround top, bottom, and side surfaces of the second encapsulation layer 182 together with the first encapsulation layer 181. The first encapsulation layer 181 and the third encapsulation layer 183 may minimize or prevent external moisture or oxygen from penetrating into the light emitting diode OD. The first encapsulation layer 181 and the third encapsulation layer 183 may be formed of an inorganic insulating material capable of low-temperature deposition, such as silicon nitride, silicon oxide, silicon oxynitride, or aluminum oxide.

The second encapsulation layer 182 may serve as a buffer to relieve stress between layers due to bending of the display device (10 of FIG. 1), and may flatten steps between layers. The second encapsulation layer 182 may be formed on the substrate 101 on which the first encapsulation layer 181 is formed, using a non-photosensitive organic insulating material such as acrylic resin, epoxy resin, phenolic resin, polyamide resin, polyimide resin, polyethylene, or silicon oxycarbon (SiOC), or a photosensitive organic insulating material such as photo acrylic, but not limited thereto. When the second encapsulation layer 182 is formed through an inkjet method, a dam DAM may be formed in the non-display region NA to prevent the second encapsulation layer 182 in liquid form from spreading to an edge of the substrate 101. The dam DAM may be disposed closer to the edge of the substrate 101 than the second encapsulation layer 182. The dam DAM may prevent the second encapsulation layer 182 from spreading into a pad region, where a conductive pad is disposed, on an outermost side of the substrate 101.

The dam DAM is designed to prevent the spreading of the second encapsulation layer 182, but if the second encapsulation layer 182 is formed to exceed a height of the dam DAM during a process, the second encapsulation layer 182 as an organic layer may be exposed to an outside, so moisture, etc. may easily penetrate into the light emitting element. To prevent this, at least 10 or more dams DAMs may be formed.

The dam DAM may be formed simultaneously with the first interlayered insulating layer 125, the second interlayered insulating layer 160, and the third interlayered insulating layer 163. When forming the first interlayered insulating layer 125, a lower layer of the dam DAM may be formed together, and when forming the second and third interlayered insulating layers 160 and 163, an upper layer of the dam DAM is formed together, so that the dame DAM may be formed in a triple laminated structure. As another example, the dam DAM may be formed with one or two of the first, second and third interlayered insulating layers 125, 160 and 163.

Accordingly, the dam DAM may be formed of the same materials as the first interlayered insulating layer 125, the second interlayered insulating layer 160, and the third interlayered insulating layer 163, but not limited thereto.

The dam DAM may be formed to overlap a low-potential driving power line VSS. For example, the low-potential driving power line VSS may be formed at a lower layer of a region, where the dam DAM is located, in the non-display region NA.

The low-potential driving power line VSS and the gate driving portion 300 configured in a gate in panel (GIP) structure may be formed to surround a periphery of the display panel 100, and the low-potential driving power line VSS may be located outside the gate driving portion 300. In addition, the low-potential driving power line VSS may be connected to the cathode electrode 173 to supply the low-potential driving voltage (EVSS of FIG. 3). The gate driving portion 300 is simply shown in the plan and cross-sectional drawings, but may have the same structure as the first and/or second thin film transistor TFT1 and/or TFT2 in the display region AA.

A touch layer 190 may be disposed on the encapsulation layer 180. In the touch layer 190, a touch buffer layer 191 may be located between a touch sensor metal including touch electrode connection lines 192 and 194 and touch electrodes 195 and 196, and the cathode electrode 173 of the light emitting diode OD.

The touch buffer layer 191 may prevent a chemical solution (e.g., developer, etchant, etc.) used during a manufacturing process of the touch sensor metal disposed on the touch buffer layer 191 or moisture from the outside from penetrating into the light emitting layer 172 containing an organic material. Accordingly, the touch buffer layer 191 may prevent damage to the light emitting layer 172 which is vulnerable to the chemical solution or moisture.

According to a mutual-capacitance-based touch sensor structure, the touch electrodes 195 and 196 may be disposed on the touch buffer layer 191, and the touch electrodes 195 and 196 may be disposed to cross each other.

The touch electrode connection lines 192 and 194 may electrically connect the touch electrodes 195 and 196. The touch electrode connection lines 192 and 194 and the touch electrodes 195 and 196 may be located at different layers with a touch insulating layer 193 interposed therebetween.

At least portion of the touch electrode connection lines 192 and 194 may be arranged to overlap the bank layer 165, thereby preventing a decrease in aperture ratio.

Meanwhile, the touch electrodes 195 and 196 may be electrically connected to a touch driving circuit (not shown) through a portion of the touch electrode connection line 192 which extends along the top and side surfaces of the encapsulation layer 180 and the top and side surfaces of the dam DAM and is connected to the touch pad 198.

The portion of the touch electrode connection line 192 may receive a touch driving signal from the touch driving circuit and transmit it to the touch electrodes 195 and 196, and may transmit a touch sensing signal from the touch electrodes 195 and 196 to the touch driving circuit.

A touch protective layer 197 may be disposed on the touch electrodes 195 and 196. In the drawing, the touch protective layer 197 is shown as being disposed on the touch electrodes 195 and 196, but not limited thereto, and the touch protective layer 197 may extend before or after the dam DAM to be disposed on the touch electrode connection line 192.

In addition, a color filter (not shown) may be disposed over the encapsulation layer 180. The color filter may be located on the touch layer 190, or between the encapsulation layer 180 and the touch layer 190.

Hereinafter, when driving in the multi-frequency mode according to an aspect of the present disclosure, for example, in the multi-frequency mode with change from a high-frequency driving to a low-frequency driving along the scan direction, driving structure and method that may provide a normal scan signal to a horizontal line (or scan line) located near the boundary AB of the first region A1, which is a high-frequency driving region, is described in detail.

Figure 6:
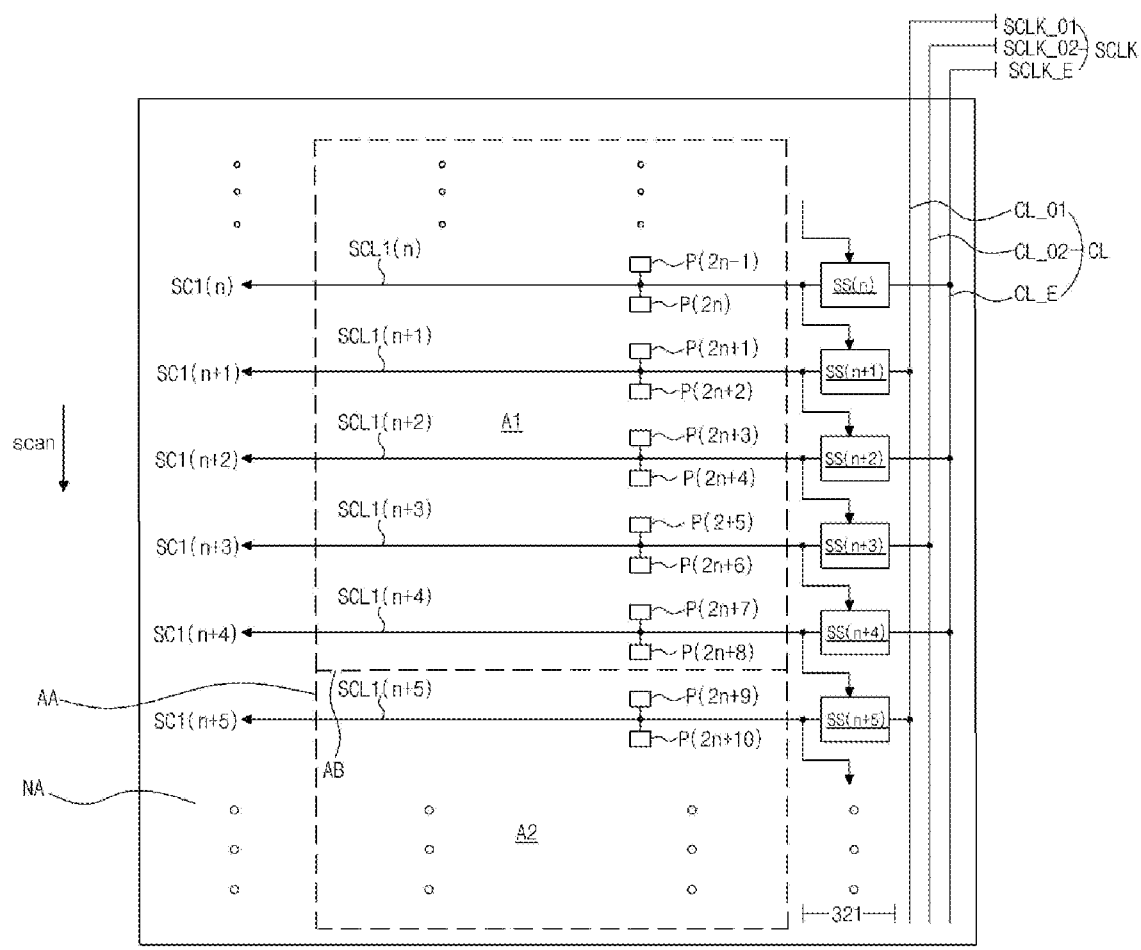
FIG. 6 is a view schematically illustrating a display panel and a first scan driving portion of a light emitting display device according to an aspect of the present disclosure.
Figure 7:
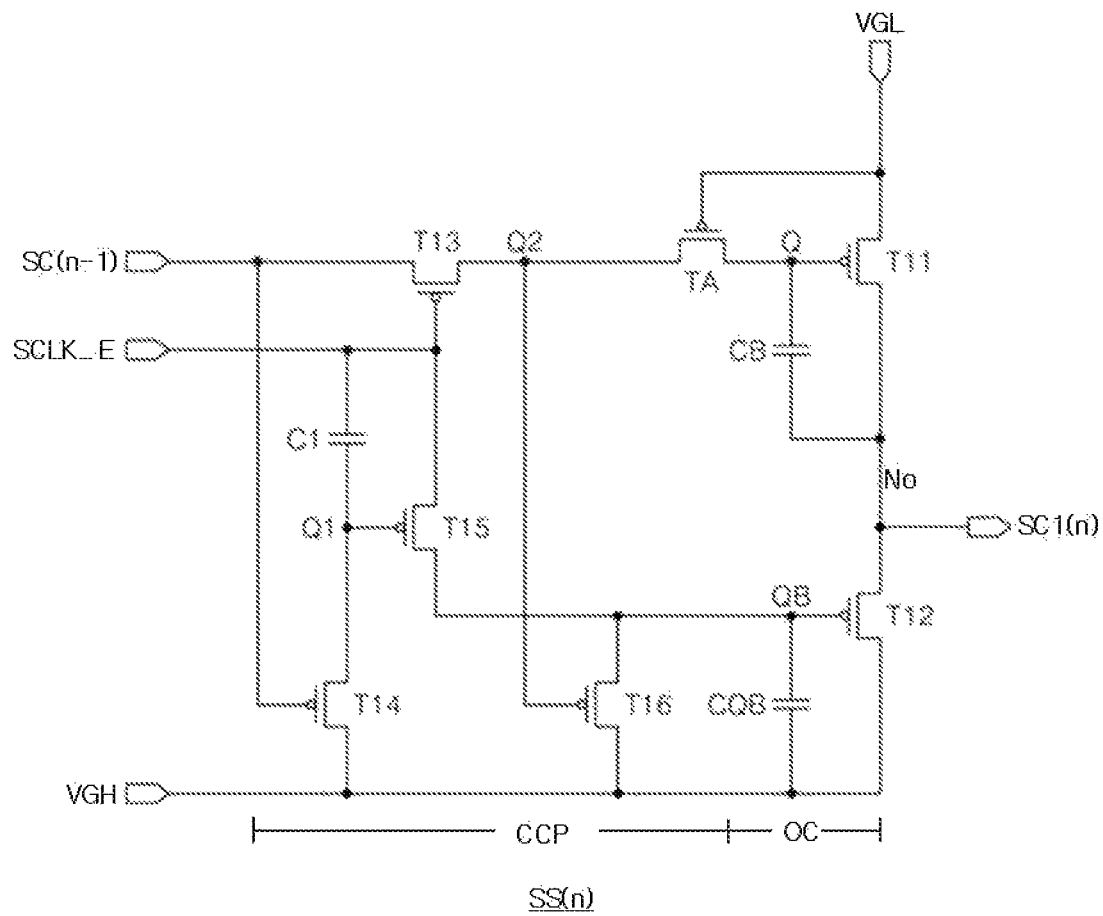
FIG. 7 is a circuit diagram schematically illustrating an example of a configuration of a first scan driving portion according to an aspect of the present disclosure.
Figure 8:
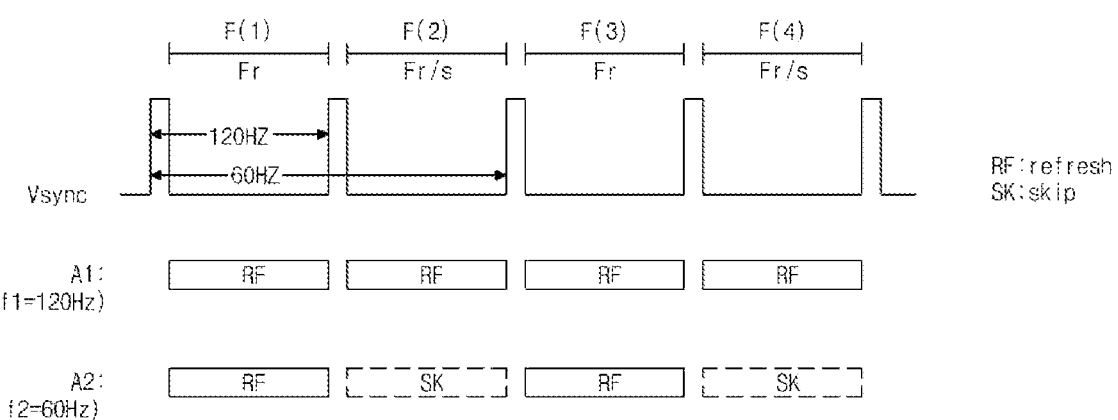
FIG. 8 is a view schematically illustrating refresh and skip operations of first and second regions in a multi-frequency mode driving according to an aspect of the present disclosure.

FIG. 6 is a view schematically illustrating a display panel and a first scan driving portion of a light emitting display device according to an aspect of the present disclosure. FIG. 7 is a circuit diagram schematically illustrating an example of a configuration of a first scan driving portion according to an aspect of the present disclosure. FIG. 8 is a view schematically illustrating refresh and skip operations of first and second regions in a multi-frequency mode driving according to an aspect of the present disclosure.

Referring to FIGS. 6 and 7, the display region AA of the display panel 100 of this aspect may include the first and second regions A1 and A2 that may be driven individually with separated frequencies when driving in the multi-frequency mode.

The first and second regions A1 and A2 may be arranged along the scan direction. For example, the first region A1 may be defined in an upper portion of the display region AA as a prior scan region, and the second region A2 may be defined in a lower portion of the display region AA as a posterior scan region.

Meanwhile, in this aspect, for convenience of explanation, a case where the boundary AB between the first region A1 and the second region A2 is set between horizontal lines (e.g., 2n+7-th and 2n+8-th horizontal lines) of the display region AA connected to a n+4-th first scan line SCL1 (n+4), and horizontal lines (e.g., 2n+9-th and 2n+10-th horizontal lines) of the display region AA connected to a n+5-th first scan line SCL1 (n+5) is taken as an example.

In each of the first and second regions A1 and A2, the plurality of pixels P may be arranged along each horizontal line. As mentioned above, FIG. 3 may be referred to for the structure of each pixel P. In FIG. 6, the pixels P located on 2n−1-th to 2n+10-th horizontal lines are indicated by P(2n−1) to P(2n+10), respectively.

Meanwhile, in this aspect, a case where odd and even horizontal lines as two adjacent horizontal lines, for example, 2n−1-th and 2n-th horizontal lines share the first scan signal SC1 (n) is taken as an example. In other words, a case where the odd and even horizontal lines, for example, the 2n−1-th and 2n-th horizontal lines are commonly connected to the corresponding n-th first scan line SCL1 (n) is taken as an example.

As mentioned above, the non-display region NA of the display panel 100 may include the first scan driving portion 321 that sequentially outputs the first scan signals SC1 to the first scan lines SCL1.

The first scan driving portion 321 may include a plurality of scan stages (or a plurality of first scan stages) SS that respectively correspond to the plurality of first scan lines SCL1 arranged in the display region AA and output the respective first scan signals SC1. For example, referring to FIG. 6, the n-th to n+5-th scan stage SS(n) to SS(n+5) are respectively connected to the n-th to n+5-th first scan lines SCL1(n) to SCL1(n+5) and respectively output the n-th to n+5-th first scan signals SC1(n) to SC1(n+5).

Each scan stage SS may receive an output signal of the previous scan stage SS, for example, the previous first scan signal SC1. In response to a corresponding scan clock SCLK input thereto, each scan stage SS may shift the previous first scan signal SC1 by a pulse width of the scan clock SCLK and output it.

In relation to the scan clock SCLK corresponding to each scan stage SS, for example, an odd scan clock SCLK_O1 or SCLK_O2 may be input to the odd scan stages (e.g., SS(n+1), SS(n+3), and SS(n+5)). An even scan clock SCLK_E whose phase (or timing) is different from the odd scan clocks SCLK_O1 and SCLK_O2 may be input to the even scan stages (e.g., SS(n), SS(n+2), and SS(n+4)).

In this aspect, the two odd scan clocks SCLK_O1 and SCLK_O2 may be used. For example, the odd first and second scan clocks SCLK_O1 and SCLK_O2 having the same phase (or timing) of clock pulse may be used.

In this regard, to the odd stages SS(n+1), SS(n+3), and SS(n+5), the odd first and second scan clocks SCLK_O1 and SCLK_O2 may be input alternately. For example, the odd first scan clock SCLK_O1 may be input to the n+1-th scan stage SS(n+1), the odd second scan clock SCLK_O2 may be input to the n+3-th scan stage SS(n+3), and the odd first scan clock SCLK_O1 may be input to the n+5-th scan stage SS(n+5).

Odd first and second scan clock lines CL_O1 and CL_O2 and an even scan clock line CL_E for transmitting the odd first and second scan clocks SCLK_O1 and SCLK_O2 and the even scan clock SCLK_E may be formed in the non-display region NA of the display panel 100.

A configuration of the scan stage SS that outputs the first scan signal SC1 as described above is described with reference to FIG. 7. In FIG. 7, for convenience of explanation, the configuration of the n-th stage SS(n) to which the even scan clock SCLK_E is input as a shift clock is taken as an example.

Referring to FIG. 7, each stage SS(n) of the first scan driving portion 321 may include, for example, an output part OC that outputs the corresponding scan signal SC1(n), and a control part CCP that controls the output operation of an output part OC.

In this regard, the output part OC may include, for example, a pull-up transistor (or Q transistor) T11, a pull-down transistor (or QB transistor) T12, a Q capacitor (CB), and a QB capacitor (CQB).

The control part CCP may include, for example, a transfer transistor TA, an eighth transistor (or first transistor) T13, a ninth transistor (or second transistor) T14, a tenth transistor (or third transistor) T15, an eleventh transistor (or fourth transistor) T16, and an on capacitor C1.

Here, each of the transistors T11 to T16 and TA of the stage SS (n) may be a P-type transistor or an N-type transistor. In the aspect of FIG. 7, for convenience of explanation, an example is taken where the transistors T11 to T16 and TA of the stage SS (n) are all P-type transistors. However, the present disclosure is not limited thereto, and all or part of the transistors T11 to T16 and TA may be P-type transistors or N-type transistors. In addition, each of the transistors T11 to T16 and TA of the stage SS (n) may be an oxide transistor or a polycrystalline silicon transistor. For example, in case of using an N-type transistor, the N-type transistor may be an oxide transistor, and in case of using a P-type transistor, the P-type transistor may be a polycrystalline silicon transistor, but not limited thereto.

Meanwhile, the circuit structure of the stage SS(n) of the first scan driving portion 321 in FIG. 7 may be applied as circuit structures of stages of the second to fourth scan driving portions (322 to 324 of FIG. 2) and the emission control driving portion (310 of FIG. 2), but not limited thereto. Alternatively, the circuit structure of the stage of at least one of the second to fourth scan drivers and the light emission control driving portion may have a different structure from the circuit structure of the stage SS(n) of the first scan driving portion 321.

The pull-up transistor T11 of the control part OC may pull up an output terminal (or output node) NO of the stage SS(n) in response to a signal of the Q node that is connected to a gate electrode of the pull-up transistor T11, and the pull-down transistor T12 may pull down the output terminal NO in response to a signal of the QB node that is connected to a gate electrode of the pull-down transistor T12.

For example, a first electrode (or drain electrode) of the pull-up transistor T11 may receive the gate low voltage VGL and a second electrode (or source electrode) of the pull-up transistor T11 may be connected to the output terminal NO of the scan stage SS(n). A first electrode of the pull-down transistor T12 may be connected to the output terminal NO and a second electrode of the pull-down transistor T12 may receive the gate high voltage VGH.

The transfer transistor TA may transfer charges of a Q2 node to the Q node in response to the gate low voltage VGL. For example, a gate electrode of the transfer transistor TA may be applied with the gate low voltage VGL, a first electrode of the transfer transistor TA may be connected to the Q node, and a second electrode of the transfer transistor TA may be connected to the Q2 node.

The eighth transistor T13 may provide the previous first scan signal SC(n−1), which is an output signal of the previous scan stage, to the Q2 node in response to the corresponding scan clock SCLK_E. For example, a gate electrode of the eighth transistor T13 may receive the corresponding scan clock SCLK_E, a first electrode of the eighth transistor T13 may be connected to the Q2 node, and a second electrode of the eighth transistor T13 may receive the first scan signal SC(n−1).

The ninth transistor T14 may transmit the gate high voltage VGH to the Q1 node in response to the previous first scan signal SC(n−1). For example, a gate electrode of the ninth transistor T14 may receive the first scan signal SC(n−1), a first electrode of the ninth transistor T14 may be connected to the Q1 node, and a second electrode of the ninth transistor T14 may receive the gate high voltage VGH.

The tenth transistor T15 may provide the scan clock SCLK_E to the QB node in response to the voltage of the Q1 node. For example, a gate electrode of the tenth transistor T15 may be connected to the Q1 node, a first electrode of the tenth transistor T15 may receive the scan clock SCLK_E, and a second electrode of the tenth transistor T15 may be connected to the QB node.

The eleventh transistor T16 may transmit the gate high voltage VGH to the QB node in response to the voltage of the Q2 node. For example, a gate electrode of the eleventh transistor T16 may be connected to the Q2 node, a first electrode of the eleventh transistor T16 may be connected to the QB node, and a second electrode of the eleventh transistor T16 may receive the gate high voltage VGH.

The Q capacitor CB may be coupled between the Q node and the output terminal NO, the QB capacitor CQB may be coupled between the QB node and the gate high voltage VGH, and the on capacitor C1 may be coupled between the scan clock SCLK_E and the Q1 node.

The scan stage SS(n) configured as above may shift the previous first scan signal SC1 according to the corresponding scan clock SCLK_E and output it to the corresponding first scan line SCL1(n).

The multi-frequency mode driving of this aspect is described with reference to FIG. 8. In FIG. 8, for convenience of explanation, a case where a first frequency f1 which is a driving frequency of the first region A1 is a high frequency, for example, 120 Hz, and a second frequency f2 which is a driving frequency of the second region A2 is a low frequency, for example, 60 Hz is taken as an example.

In this case, a number of driving frames (or frames) F of the display panel 100 may be set according to the first frequency f1 of the first region A1 which is a high-frequency region. For example, the number of driving frames (or frames) F of the display panel 100 may be set. Corresponding to the first frequency f1 of 120 Hz, 120 driving frames F may be set per second for the display panel 100.

In this case, for example, the first region A1 is supplied with data voltages every driving frame F so that the displayed image may be refreshed (or updated). In this regard, for example, in each of first to fourth driving frames F (1) to F (4), the first region A1 may perform an image refresh operation. Accordingly, the first scan signals SC1 may be applied to the first region A1 every frame F.

As such, from the perspective of the first region A1, each driving frame F of the display panel 100 may be a refresh frame of the first region A1.

Meanwhile, since the second region A2 may be driven at the second frequency f2, which is a low frequency, a refresh operation may be performed in some driving frames F, which have a refresh period according to the second frequency f2, among the driving frames F of the display panel 100, and the refresh operation may be skipped in the remaining driving frames between the refresh driving frames of the second frequency f2.

For example, in the first and third driving frames F(1) and F(3), the second region A2 may perform the image refresh operation together with the first region A1. In each of the second and fourth driving frames F(2) and F(4), the second region A2 may skip (or turn off) the image refresh operation, differently from the first region A1. Accordingly, in the second region A2, the output of the first scan signals SC1, more particularly, the output of the scan pulses may be turned on in the driving frames F(1) and F(3) in which the refresh is performed according to the second frequency f2, and the output of the first scan signals SC1, more particularly, the output of the scan pulses may be turned off (or stopped or skipped) in the driving frames F(2) and F(4) in which the refresh skip is performed.

As such, from the perspective of the second region A2, the refresh rate may be changed to a low frequency, so that some driving frames F(1) and F(3) may become refresh frames and the remaining driving frames F(2) and F(4) may become skip frames.

In summary, among the driving frames (F: F(1) to F(4)) of the display panel 100, the driving frames F(1) and F(3) in which the low-frequency second region A2 is refreshed may be said to be refresh driving frames Fr since both the first and second regions A1 and A2 are refreshed.

Meanwhile, the driving frames F(2) and F(4) in which the low-frequency second region A2 is refreshed may be said to refresh/skip driving frames Fr/s since the first region A1 is refreshed and the second region A2 is refresh-skipped.

In the refresh driving frame Fr in which the first and second regions A1 and A2 are refreshed together, the first scan signals SC1 may be output sequentially along the scan direction for the entire display panel 100, as in the normal mode driving.

Meanwhile, in the refresh/skip driving frame Fr/s in which the first and second regions A1 and A2 are separated into refresh/skip operations, unlike the normal mode driving (refresh driving frame (Fr)), the first scan signals SC1 may be sequentially output to the first region A1 of the display panel 100, and the output of the first scan signals SC1 to the second region A2 may be stopped.

Figure 9:
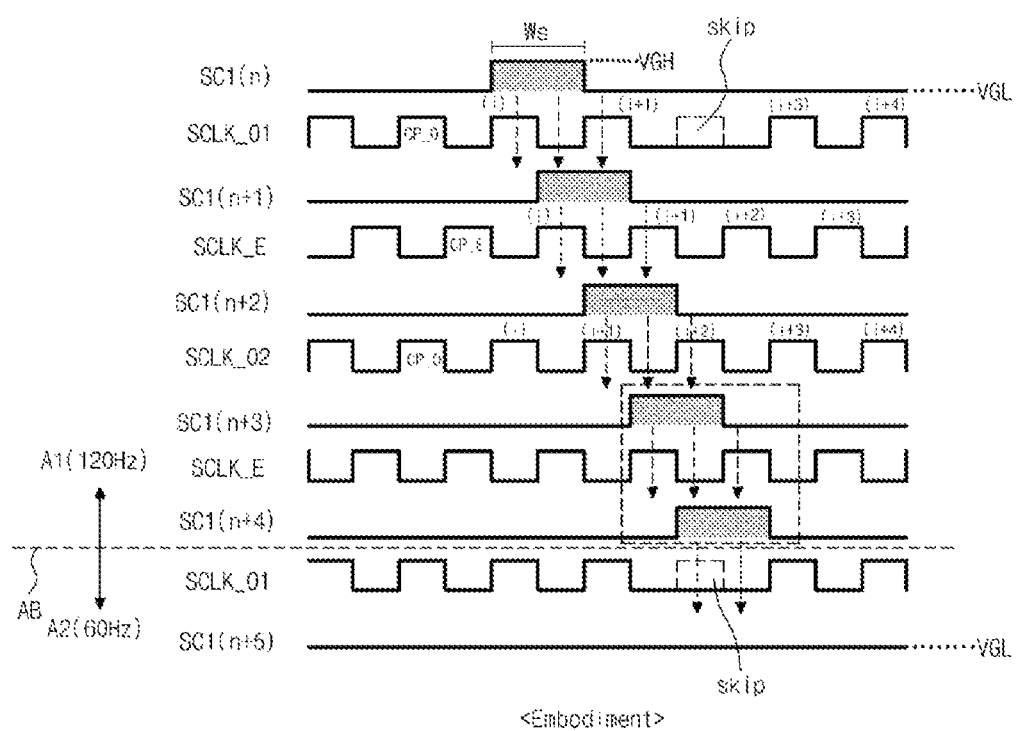
FIG. 9 is a timing diagram illustrating output-on/off operations of first scan signals for each of first and second regions in a refresh/skip driving frame in a multi-frequency mode according to an aspect of the present disclosure.

The driving in which the output of the first scan signals SC1 for the first and second regions A1 and A2 is separated in on/off states in the refresh/skip driving frame Fr/s is described with further reference to FIG. 9.

FIG. 9 is a timing diagram illustrating output-on/off operations of first scan signals for each of first and second regions in a refresh/skip driving frame in a multi-frequency mode according to an aspect of the present disclosure.

Referring to FIG. 9 along with FIGS. 6 to 8, as mentioned above, each scan stage SS of the first scan driving portion 321 may shift and output the previous first scan signal SC1 according to the corresponding scan clock SCLK.

For example, the n+1-th scan stage SS(n+1), which is an odd scan stage, may receive the first scan signal SC1(n) of the n-th stage SS(n), and in response to the corresponding odd first scan clock SCLK_O1, may output the n+1-th first scan signal SC1(n+1).

In this regard, for example, in the n+1-th scan stage SS(n+1), an output of a scan pulse (or high-voltage scan pulse) of the n+1-th first scan signal SC1(n+1) may begin at a point when a high-level (or off-level) clock pulse CP_O of the odd first scan clock SCLK_O1, which corresponds to a scan pulse of the n-th first scan signal SC1(n), for example, an i-th clock pulse CP_O(i) switches (or changes) to a low level (or on level) (or an falling edge of the clock pulse CP_O(i)). In addition, the output of the scan pulse of the n+1-th first scan signal SC1(n+1) may end at a level transition point of the next i+1-th clock pulse CP_O(i+1). In other words, the output of the scan pulse of the n+1-th first scan signal SC1(n+1) may be begin by the i-th clock pulse CP_O(i) overlapping (or corresponding to) a first half of the scan pulse of the n-th first scan signal SC1(n), and the output of the scan pulse of the n+1-th first scan signal SC1(n+1) may end by the i+1-th clock pulse CP_O(i+1).

As such, the n+1-th scan stage SS(n+1) may use two consecutive clock pulses CP_O(i) and CP_O(i+1) of the odd first scan clock SCLK_O1 to generate and output the n+1-th first scan signal SC1(n+1).

A width Ws of the scan pulse of the first scan signal SC1(n+1) generated in this way may depend on a period of the clock pulse CP_O of the corresponding odd first scan clock SCLK_O1. For example, the width Ws of the scan pulse may be four times a horizontal period (H) of each horizontal line of the display panel 100, but not limited thereto.

Meanwhile, in this aspect, a case where each first scan signal SC1 is shared by two horizontal lines of the display panel 100 is taken as an example, so the width Ws of the scan pulse of each first scan signal SC1 may correspond to four horizontal periods (4H).

Similar to above, the n+2-th scan stage SS(n+2), which is an even scan stage, may receive the first scan signal SC1 (n+1) of the n+1-th scan stage SS(n+1), and in response to the corresponding even scan clock SCLK_E, may output the n+2-th first scan signal SC1(n+2). In other words, the n+2-th scan stage SS(n+2) may use two consecutive clock pulses CP_E of the even scan clock SCLK_E, for example, i-th and i+1-th clock pulses CP_E(i) and CP_E(i+1) to generate and output the n+2-th first scan signal SC1(n+2).

Next, the n+3-th scan stage SS(n+3) may receive the first scan signal SC1(n+2) of the n+2-th scan stage SS(n+2), and in response to the corresponding odd second scan clock SCLK_O2, may output the n+3-th first scan signal SC1(n+3). In other words, the n+3-th scan stage SS(n+3) may use two consecutive clock pulses of the odd second scan clock SCLK_O2, for example, i+1-th and i+2-th clock pulses CP_O(i+1), CP_O(i+2) to generate and output the n+3-th first scan signal SC1(n+3).

Next, the n+4-th scan stage SS(n+4) may receive the first scan signal SC1(n+3) of the n+3-th scan stage SS(n+3), and in response to the corresponding even scan clock SCLK_E, may output the n+4-th first scan signal SC1(n+4). In other words, the n+4-th scan stage SS(n+4) may use two consecutive clock pulses of the even scan clock SCLK_E, for example, i+1-th and i+2-th clock pulses CP_E(i+1) and CP_E(i+2) to generate and output the n+4-th first scan signal SC1(n+4).

Through the above processes, the first scan signals SC1 with normal scan pulse width Ws may be generated up to the n+4-th first scan line SCL1(n+4) which is the last first scan line SCL1 of the first region A1 driven at high frequency, and these first scan signals SC1 may be sequentially output to the first scan lines SCL1 of the first region A1.

Next, the n+5-th scan stage SS(n+5) as an odd scan stage, which is connected to the n+5-th first scan line SCL1(n+5) as the first scan wire SCL1 that is first scanned in the second region A2, may receive the first scan signal SC1(n+4) of the n+4-th scan stage SS(n+4). In addition, the n+5-th scan stage SS(n+5) may receive the corresponding odd first scan clock SCLK_O1.

At this time, regarding the odd first scan clock SCLK_O1 corresponding to the n+5-th scan stage SS(n+5), an i+2-th clock pulse CP_O(i+2), which is used as a clock pulse that starts a scan pulse output of the n+5th scan stage SS(n+5) during the refresh driving frames in the normal mode or multi-frequency mode, may be in a skipped (or off, omitted, or removed) state during the refresh/skip driving frame in the multi-frequency mode.

Accordingly, the scan pulse output of the n+5-th scan stage SS(n+5) may be turned off, and the n+5-th first scan signal SC1(n+5) of the n+5-th scan stage SS(n+5) may continue to be at the low voltage VGL without a scan pulse.

In other words, from the perspective of the n+5-th scan stage SS(n+5), the i+2-th clock pulse CP_O(i+2) may be skipped (or removed) from the odd first scan clock SCLK_O1, so a clock pulse immediately following the i+1-th clock pulse CP_O(i+1) may become a i+3-th clock pulse CP_O(i+3).

Since the i+2-th clock pulse CP_O(i+2) corresponding to the scan pulse of the n+4-th first scan signal SC1(n+4) input to the n+5-th scan stage SS(n+5) is omitted, the n+5-th scan stage SS(n+5) may not perform the shift operation of scan pulse, the low voltage VGL output according to the i+1-th clock pulse CP_O(i+1) may be maintained until the i+3-th clock pulse CP_O(i+3).

As such, as the clock pulse that determines the scan pulse output in the odd first scan clock SCLK_O1 is skipped, the n+5-th scan stage SS (n+5) may not shift the scan pulse of the n+4-th first scan signal SC1 (n+4), so that the n+5-th first scan signal SC1 (n+5) may continuously maintain the low voltage VGL without a scan pulse.

Therefore, regarding the n+5-th first scan line SCL1 (n+5), which is the first scan line SCL1 first started in the second region A2, the n+5-th scan stage SS (n+5) connected thereto may turn off the output of the n+5-th first scan signal SC1 (n+5), more particularly, the output of the scan pulse.

Accordingly, the n+6-th scan stage located after the n+5-th scan stage SS (n+5) may receive the n+5-th first scan signal SC1 maintained at the low voltage VGL, and in response to the corresponding even scan clock SCLK_O, may output the n+6-th first scan signal in which the low voltage VGL is continuously maintained without a scan pulse.

In this way, each of the n+7-th to last scan stages located in the second region A2 may receive the previous first scan signal SC1 maintained at the low voltage VGL, and in response to the corresponding odd first or second scan clock SCLK_O1 or SCLK_O2, or even scan clock SCLK_E, may output the first scan signal SC1 in which the low voltage VGL is continuously maintained without a scan pulse.

Through the above processes, it is possible to turn off the output of the first scan signals SC1, more particularly, the output of the scan pulses to the first scan lines SCL1 located in the second region A1 driven at a low frequency.

As described above, according to this aspect, in the light emitting display device 10 capable of being driven in the multi-frequency mode, regarding the scan clocks SCLK that shift the first scan signals SC1 applied to the sampling transistors (T1 of FIG. 3) of the pixels P, the odd scan clock SLCK_O may be separated into the odd first and second scan clocks SCLK_O1 and SCLK_O2, and the odd first and second scan clocks SCLK_O1 and SCLK_O2 may be provided alternately to the odd scan stages (e.g., SS (n+1) to SS (n+5)).

Accordingly, when driving in the multi-frequency mode, in the refresh/skip driving frame in which the high-frequency first region A1 is refreshed and the low-frequency second region A2 is refresh-skipped, for the odd scan clock SCLK_O, for example, the first scan clock SCLK_O1 provided to the n+5-th scan stage SS (n+5) connected to the n+5-th first scan line SCL1 (n+5) that is the first scan line SCL1 first started in the second region A2, the clock pulse CP_O (i+2) may be skipped corresponding to the output transition timing of the first scan signals between the first and second regions A1 and A2 (or corresponding to the output timing of the last first scan signal of the first region A1).

Accordingly, the first scan signal SC1 of the normal pulse width Ws may also be generated and applied to the first scan line SCL1 of the first region A1 located near the boundary AB between the first and second regions A1 and A2.

Accordingly, the data voltages Vdata may be normally charged in the pixels P located in the first region A1 near the boundary AB, allowing the pixels to express normal luminance. Thus, a phenomenon, in which when using one odd scan clock, a pulse width of a first scan signal is shortened and the data voltage is not charged normally, so an abnormal luminance change (e.g., an increase of luminance) occurs, may be alleviated. As a result, image quality may be improved.

A comparative example using the one odd scan clock is described with reference to FIG. 10.

Figure 10:
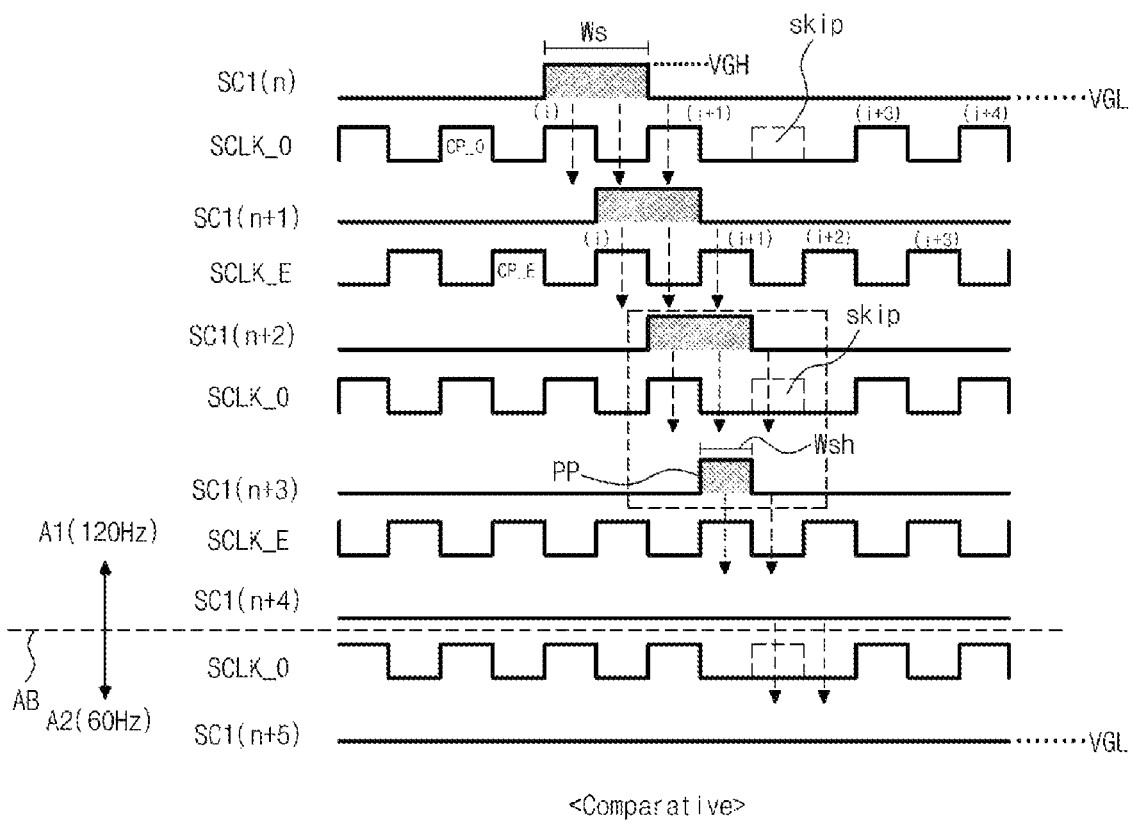
FIG. 10 is a timing diagram illustrating output-on/off operations of first scan signals for each of first and second regions in a refresh/skip driving frame in a multi-frequency mode according to a comparative example.

FIG. 10 is a timing diagram illustrating output-on/off operations of first scan signals for each of first and second regions in a refresh/skip driving frame in a multi-frequency mode according to a comparative example.

Referring to FIG. 10 together with FIG. 9, compared to the above-described aspect, in the case of the comparative example, one (or single) scan clock SCLK_O is used as an odd scan clock SCLK_O.

As one odd scan clock SCLK_O is used, during the refresh/skip driving frame of the multi-frequency mode, the odd scan clock SCLK_O has the same waveform as the odd first scan clock (SCLK_O1 of FIG. 9) of the aspect to turn off the output of the scan pulses to the second region A2.

In this regard, unlike the aspect, in the comparative example, since only one odd scan clock SCLK_O is used, the clock pulse of the odd scan clock SCLK_O is skipped corresponding to the output transition timing of the first scan signals between the first and second regions A1 and A2 i.e., corresponding to the output timing of the n+4-th first scan signal SC (n+4) that is the last first scan signal of the first region A1.

In this case, the n+3-th stage SS(n+3) connected to the n+3-th first scan line SCL1($n$+3) of the first region A1 receives the first scan signal SC1($n$+2) of the n+2-th stage SS(n+2), and output the n+3-th first scan signal SC1($n$+3) in response to the odd scan clock SCLK_O.

At this time, since the i+2-th clock pulse CP_O(i+2) is skipped and does not exist in the odd scan clock SCLK_O, an end timing of a scan pulse PP of the n+3-th first scan signal SC1($n$+3) of the n+3-th scan stage SS(n+3) is substantially the same as an end timing of the scan pulse of the n+2-th first scan signal SC1($n$+2).

In other words, since the i+2-th clock pulse CP_O(i+2) is skipped and does not exist in the odd scan clock SCLK_O, the scan pulse PP of the n+3-th first scan signal SC1($n$+3) starts at a transition point to a low level of the i+2-th clock pulse CP_O(i+2) and ends at an end point of the scan pulse of the n+2-th first scan signal SC1($n$+2).

Accordingly, a width Wsh of the scan pulse PP of the n+3-th first scan signal SC1 (n+3) is substantially shortened by approximately half compared to that of the aspect of FIG. 9.

Due to this, the pixels P arranged on the 2n+5-th and 2n+6-th horizontal lines, which are the horizontal lines connected to the n+3-th first scan line SCL(n+3), do not substantially charge the data voltages normally.

For example, by shortening the width Wsh of the scan pulse PP of the n+3-th first scan signal SC1 (n+3), the sampling transistor (T1 of FIG. 3), to which the first scan signal SC1($n$+3) is applied, is turned off abnormally early. As a result, in the data sampling period (Ts2 of FIG. 4), when the data voltage (Vdata of FIG. 3) is charged to the driving transistor (DT of FIG. 3) through the sampling transistor, the sampling transistor is turned off, and the data voltage does not charge properly.

Accordingly, due to the abnormal data voltage charging operation, an abnormal luminance change occurs, such as expressing a luminance higher than the desired luminance, thereby deteriorating image quality.

Moreover, as the width Wsh of the scan pulse PP of the n+3-th first scan signal SC1($n$+3) becomes shorter as above, a scan pulse of the n+4-th first scan signal SC1($n$+4) output by shifting the n+3-th first scan signal SC1($n$+3) may not be generated.

In this regard, the n+4-th scan stage SS(n+4) connected to the n+4-th first scan line SCL1($n$+4) located at the end of the first region A1 receives the abnormal first scan signal SC1($n$+3) of the n+3-th scan stage SS(n+2), and outputs the n+4-th first scan signal SC1($n$+4) in response to the even scan clock SCLK_E.

At this time, as mentioned above, the width Wsh of the scan pulse PP of the n+3-th first scan signal SC1($n$+3) becomes shorter.

Due to this, at a point when the i+1-th clock pulse CP_E(i+1) of the even scan clock SCLK_E for generating the n+4-th first scan signal SC1($n$+4) switches to a low level, the scan pulse PP of the n+3-th first scan signal SC1($n$+3) ends.

Accordingly, the n+4-th scan stage SS(n+4) is unable to substantially generate a scan pulse of the n+4-th first scan signal SC1($n$+4), so that the n+4-th first scan signal SC1($n$+4) continuously maintains the low voltage VGL without substantially any scan pulse.

Due to this, the pixels P arranged on the 2n+7-th and 2n+8-th horizontal lines, which are the horizontal lines connected to the n+4-th first scan line SCL(n+4), do not substantially charge the data voltages normally. Accordingly, due to the abnormal data voltage charging operation, an abnormal luminance change may occur, such as expressing a luminance higher than the desired luminance, thereby deteriorating image quality.

As above, in the comparative example, as one odd scan clock SCLK_O is used, the abnormal first scan signals SC1($n$+3) and SC1($n$+4) are output to the first scan lines SCL1($n$+3) and SCL1($n$+4) of the first region A1 located near the boundary AB between the first and second regions A1 and A2. In this case, the data voltages of the pixels P connected to the first scan lines SCL1($n$+3) and SCL1($n$+4) are not charged normally, causing an abnormal luminance change, resulting in deterioration of image quality.

On the other hand, according to the aspect described above, the odd scan clock SCLK_O may be divided into two to generate the odd first and second scan clocks SCLK_O1 and SCLK_O2 having substantially the same phase, which may be provided alternately to the odd scan stages (e.g., SS (n+1) to SS (n+5)).

Accordingly, when driving in the multi-frequency mode, in the refresh/skip driving frame in which the high-frequency first region A1 is refreshed and the low-frequency second region A2 skips the refresh, for the odd first scan clock SCLK_O1 input to the scan stage SS(n+5) driving the first scan line SCL1(n+5) first started in the second region A2, the clock pulse CP_O(i+2) is skipped corresponding to the frequency transition timing. In addition, for the odd second scan clock SCLK_O2 input to the scan stage SS(n+3) driving the last odd first scan line SCL1(n+3) of the high-frequency first region A1, as in the refresh driving frame during the normal mode operation or the multi-mode operation, the normal scan clock with no clock pulse skipped is used.

Accordingly, the first scan signals SC1 (n+3) and SC1 (n+4) having the normal pulse widths Ws may be provided to the first scan lines SCL1 (n+3) and SCL1 (n+4) of the high-frequency driving region A1 located near the boundary AB between the high-frequency and low-frequency driving regions A1 and A2.

Therefore, the data voltages may be normally charged to the pixels P located in the high-frequency driving region A1 near the boundary AB, allowing the pixels to express normal luminance. Thus, a phenomenon, in which when using one odd scan clock SCLK_O, the pulse width of the first scan signal is shortened and the data voltage is not charged normally, so an abnormal luminance change (for example, an increase of luminance) occurs, may be alleviated. As a result, image quality may be improved.

Moreover, in the multi-frequency mode, the refresh operation is turned off during some driving frames in the low-frequency driving region, so that low-power driving may be implemented.

As a result, according to this aspect, it is possible to improve image quality by alleviating the abnormal luminance change near the boundary between the regions where the driving frequency is transited while implementing the low-power driving.

It will be apparent to those skilled in the art that various modifications and variation may be made in the present disclosure without departing from the spirit or scope of the disclosure. Thus, it is intended that the present disclosure cover the modifications and variations of this disclosure provided they come within the scope of the appended claims and their equivalents.

What is claimed is:

1. A light emitting display device, comprising:
    a display panel including a display region defined by a plurality of pixels, the display region including first and second regions;
    a plurality of first scan lines each transmitting a first scan signal to the pixel that is disposed in each of the first and second regions; and
    a first gate driving portion including a plurality of scan stages that are respectively connected to the plurality of first scan lines,
    wherein the first and second regions are arranged along a scan direction for the plurality of first scan lines,
    wherein each of the plurality of scan stages receives an output of the first scan signal of a previous scan stage, odd scan stages among the plurality of scan stages receive odd first and second scan clocks alternately, and even scan stages among the plurality of scan stages receive an even scan clock,
    wherein in a multi-frequency mode in which the first region is driven at a higher frequency than the second region,
    the odd first scan clock is provided to a (n+5)th scan stage connected to a (n+5)th first scan line at a begin of the second region,
    the even scan clock is provided to a (n+4)th scan stage connected to a (n+4)th first scan line at an end of the first region, and
    the odd second scan clock is provided to a (n+3)th scan stage connected to a (n+3)th first scan line of the first region, and
    wherein in the multi-frequency mode, during a driving frame when the first region is refreshed and a refresh of the second region is skipped, the odd first scan clock is configured such that an (i+2)th clock pulse thereof corresponding to a scan pulse of the first scan signal of the (n+4)th first scan line is omitted.

2. The light emitting display device of claim 1, wherein in the multi-frequency mode, during the driving frame when the first region is refreshed and the refresh of the second region is skipped, the odd second scan clock has the (i+2)th clock pulse.

3. The light emitting display device of claim 1, wherein in the multi-frequency mode, during the driving frame when the first region is refreshed and the refresh of the second region is skipped,
    the odd second scan clock has an (i+1)th clock pulse and an (i+3)th clock pulse immediately before and after the (i+2)th clock pulse, respectively, and
    the odd first scan clock has the (i+3)th clock pulse immediately after the i+1-th clock pulse.

4. The light emitting display device of claim 1, wherein in the multi-frequency mode, during a driving frame when the first and second regions are refreshed, the odd first scan clock has the (i+2)th clock pulse.

5. The light emitting display device of claim 1, wherein in response to the even scan clock, the (n+4)th scan stage shifts an (n+3)th first scan signal output from the (n+3)th scan stage to output an (n+4)th first scan signal, and
    wherein in response to the odd second scan clock, the (n+3)th scan stage shifts an (n+2)th first scan signal output from an (n+2)th scan stage to output the (n+3)th first scan signal.

6. The light emitting display device of claim 1, further comprising a light emitting diode, a driving transistor and a sampling transistor disposed in each of the pixels,
    wherein the driving transistor provides a driving current to the light emitting diode,
    wherein the sampling transistor is connected between a gate electrode and a first electrode of the driving transistor, and
    wherein each of first scan lines transmits the first scan signal to the sampling transistor of the pixel that is disposed in each of the first and second regions.

7. The light emitting display device of claim 6, wherein the pixel includes a data supply transistor which includes a first electrode connected to a second electrode of the driving transistor, a second electrode connected to a data line, and a gate electrode receiving a second scan signal.

8. The light emitting display device of claim 6, wherein each of the scan stages includes:
    a pull-up transistor which includes a gate electrode connected to a Q node, a first electrode receiving an on voltage, and a second electrode connected to an output terminal that is connected to the first scan line;

a pull-down transistor which includes a gate electrode connected to a QB node, a first electrode connected to the output terminal, and a second electrode receiving an off voltage;

a transfer transistor connected between the Q node and a Q2 node, and including a gate electrode receiving the on voltage;

a first transistor which includes a first electrode connected to the Q2 node, a second electrode receiving the first scan signal of the previous scan stage, and a gate electrode receiving a scan clock corresponding to the scan stage;

a second transistor which includes a first electrode connected to a Q1 node, a second electrode receiving the off voltage, and a gate electrode receiving the first scan signal of the previous scan stage;

a third transistor which includes a first electrode receiving the scan clock corresponding to the scan stage, a second electrode connected to the QB node, and a gate electrode connected to the Q1 node;

a fourth transistor which includes a first electrode connected to the QB node, a second electrode receiving the off voltage, and a gate electrode connected to the Q2 node; and an on capacitor coupled between the scan clock corresponding to the scan stage and the Q1 node.

9. The light emitting display device of claim 1, wherein in a normal mode in which the first and second regions are driven at the same frequency, the odd second scan clock has the (i+2)th clock pulse.

10. The light emitting display device of claim 1, wherein the first gate driving portion is formed with a gate in panel structure in a non-display region of the display panel outside the display region.

11. A light emitting display device, comprising:

a display panel in which a display region where a plurality of pixels are arranged is defined, the display region including first and second regions;

(n+3)th and (n+4)th first scan lines which are each arranged in the first region and connected to the corresponding pixel, and an (n+5)th first scan line which is arranged in the second region and connected to the corresponding pixel; and (n+3)th to (n+5)th scan stages which are respectively connected to the (n+3)th to (n+5)th first scan lines and output the first scan signals, wherein each of the (n+3)th to (n+5)th scan stages receives the first scan signal of a previous scan stage, the (n+3)th and (n+5)th scan stages respectively receive odd first and second scan clocks, and the (n+4)th scan stage receives an even scan clock, and wherein in a multi-frequency mode in which the first region is driven at a higher frequency than the second region, during a driving frame when the first region is refreshed and a refresh of the second region is skipped, the odd first scan clock is configured such that an (i+2)th clock pulse thereof corresponding to a scan pulse of the first scan signal of the (n+4)th first scan line is omitted.

12. The light emitting display device of claim 11, wherein in the multi-frequency mode, during the driving frame when the first region is refreshed and the refresh of the second region is skipped, the odd second scan clock has the (i+2)th clock pulse.

13. The light emitting display device of claim 11, wherein in the multi-frequency mode, during the driving frame when the first region is refreshed and the refresh of the second region is skipped, wherein the odd second scan clock has an (i+1)th clock pulse and an (i+3)th clock pulse immediately before and after the (i+2)th clock pulse, respectively, and wherein the odd first scan clock has the (i+3)th clock pulse immediately after the (i+1)th clock pulse.

14. The light emitting display device of claim 11, wherein in the multi-frequency mode, during a driving frame when the first and second regions are refreshed, the odd first scan clock has the (i+2)th clock pulse.

15. The light emitting display device of claim 11, wherein in response to the even scan clock, the (n+4)th scan stage shifts an (n+3)th first scan signal output from the (n+3)th scan stage to output an (n+4)th first scan signal, and wherein in response to the odd second scan clock, the (n+3)th scan stage shifts an (n+2)th first scan signal output from an (n+2)th scan stage to output the (n+3)th first scan signal.

16. The light emitting display device of claim 11, further comprising a light emitting diode, a driving transistor and a sampling transistor disposed in each of the pixels, the driving transistor providing a driving current to the light emitting diode, the sampling transistor connected between a gate electrode and a first electrode of the driving transistor, and the (n+3)th and the (n+4)th first scan lines are connected to the sampling transistor of the corresponding pixel, and the (n+5)th first scan line is connected to the sampling transistor of the corresponding pixel.

17. The light emitting display device of claim 16, wherein the pixel includes a data supply transistor which includes a first electrode connected to a second electrode of the driving transistor, a second electrode connected to a data line, and a gate electrode receiving a second scan signal.

18. The light emitting display device of claim 16, wherein each of the scan stages includes:

a pull-up transistor which includes a gate electrode connected to a Q node, a first electrode receiving an on voltage, and a second electrode connected to an output terminal that is connected to the first scan line;

a pull-down transistor which includes a gate electrode connected to a QB node, a first electrode connected to the output terminal, and a second electrode receiving an off voltage;

a transfer transistor connected between the Q node and a Q2 node, and including a gate electrode receiving the on voltage;

a first transistor which includes a first electrode connected to the Q2 node, a second electrode receiving the first scan signal of the previous scan stage, and a gate electrode receiving a scan clock corresponding to the scan stage;

a second transistor which includes a first electrode connected to a Q1 node, a second electrode receiving the off voltage, and a gate electrode receiving the first scan signal of the previous scan stage;

a third transistor which includes a first electrode receiving the scan clock corresponding to the scan stage, a second electrode connected to the QB node, and a gate electrode connected to the Q1 node;

a fourth transistor which includes a first electrode connected to the QB node, a second electrode receiving the off voltage, and a gate electrode connected to the Q2 node; and an on capacitor coupled between the scan clock corresponding to the scan stage and the Q1 node.

19. The light emitting display device of claim 11, wherein in a normal mode in which the first and second regions are driven at the same frequency, the odd second scan clock has the (i+2)th clock pulse.

20. The light emitting display device of claim 11, wherein the (n+3)th to (n+5)th scan stages are formed with a gate in panel structure in a non-display region of the display panel outside the display region.

21. A light emitting display device, comprising:
a display panel in which a display region where a plurality of pixels are arranged is defined, the display region including first and second regions;
a plurality of first scan lines each transmitting a first scan signal to the pixel that is disposed in each of the first and second regions, wherein the first region and the second region are disposed adjacent to each other in a scan direction for the plurality of first scan lines; and
a plurality of scan stages that are respectively connected to the plurality of first scan lines,
wherein each of the plurality of scan stages receives an output of the first scan signal of a previous scan stage, odd scan stages among the plurality of scan stages receive odd first and second scan clocks alternately, and even scan stages among the plurality of scan stages receive an even scan clock,
wherein in a multi-frequency mode in which the first region is driven at a higher frequency than the second region, the even scan clock is provided to a scan stage connected to a first scan line providing a last first scan signal of the first region, and the odd first scan clock is provided to a scan stage connected to a first scan line providing a first scan signal of second region, during a driving frame when the first region is refreshed and a refresh of the second region is skipped, a clock pulse of the odd first scan clock corresponding to a scan pulse of the last first scan signal of the first region is omitted.

* * * * *